United States Patent
Miyake et al.

(10) Patent No.: US 10,300,542 B2
(45) Date of Patent: May 28, 2019

(54) WIRE ELECTRICAL DISCHARGE MACHINING APPARATUS AND METHOD OF MANUFACTURING SEMICONDUCTOR WAFER

(71) Applicant: Mitsubishi Electric Corporation, Tokyo (JP)

(72) Inventors: Hidetaka Miyake, Tokyo (JP); Takashi Hashimoto, Tokyo (JP); Takashi Yuzawa, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 51 days.

(21) Appl. No.: 15/513,596

(22) PCT Filed: Sep. 24, 2014

(86) PCT No.: PCT/JP2014/075295
§ 371 (c)(1),
(2) Date: Mar. 23, 2017

(87) PCT Pub. No.: WO2016/046922
PCT Pub. Date: Mar. 31, 2016

(65) Prior Publication Data
US 2018/0229320 A1   Aug. 16, 2018

(51) Int. Cl.
*B23H 7/10* (2006.01)
*B23H 7/20* (2006.01)
(Continued)

(52) U.S. Cl.
CPC ............ *B23H 7/105* (2013.01); *B23H 1/028* (2013.01); *B23H 7/02* (2013.01); *H01L 21/67092* (2013.01); *H01L 21/67754* (2013.01)

(58) Field of Classification Search
CPC ..... B23H 7/10; B23H 7/20; B23H 7/06; B23H 7/065
See application file for complete search history.

(56) References Cited

U.S. PATENT DOCUMENTS

| 4,797,526 A | 1/1989 | Inoue |
| 2006/0292832 A1 | 12/2006 | Ishibashi et al. |

(Continued)

FOREIGN PATENT DOCUMENTS

| CN | 104220201 A | 12/2014 |
| JP | 56-021733 A | 2/1981 |

(Continued)

OTHER PUBLICATIONS

Machine translation of Japan Patent document No. 2011-140,088, Jun. 2018.*

(Continued)

*Primary Examiner* — Geoffrey S Evans
(74) *Attorney, Agent, or Firm* — Sughrue Mion, PLLC; Richard C. Turner

(57) ABSTRACT

A controller controls cutting of simultaneously cutting wafers by performing electrical discharge machining while moving a workpiece relative to cutting wire sections in a direction at right angles to the cutting wire sections in a plane perpendicular to the axial direction of main guide rollers and leaving a connection at which a part of each wafer that has been incompletely cut is still connected to the workpiece, and shape correction of causing the cutting wire sections to perform scanning while performing electrical discharge machining along a path of the cutting wire sections in a cutting direction at the time of the cutting to simultaneously correct the shape of a plurality of cut surfaces that are cut at the time of the cutting.

11 Claims, 6 Drawing Sheets

(51) Int. Cl.
*B23H 7/02* (2006.01)
*B23H 1/02* (2006.01)
*H01L 21/67* (2006.01)
*H01L 21/677* (2006.01)

(56) References Cited

U.S. PATENT DOCUMENTS

| | | | |
|---|---|---|---|
| 2007/0131213 A1 | 6/2007 | Matsuda | |
| 2013/0043217 A1 | 2/2013 | Yuzawa et al. | |
| 2013/0240487 A1* | 9/2013 | Miyake | B23H 1/028 219/69.12 |
| 2015/0053650 A1* | 2/2015 | Miyake | B23H 9/00 219/69.12 |

FOREIGN PATENT DOCUMENTS

| | | | |
|---|---|---|---|
| JP | 58-217228 A | | 12/1983 |
| JP | 60-172420 A | | 9/1985 |
| JP | 61-182730 A | | 8/1986 |
| JP | 62-057451 A | | 12/1987 |
| JP | 04-289056 A | | 10/1992 |
| JP | 2887635 B2 | | 4/1999 |
| JP | 2000-176930 A | | 6/2000 |
| JP | 2002-205255 A | | 7/2002 |
| JP | 2007-030155 A | | 2/2007 |
| JP | 2007-160431 A | | 6/2007 |
| JP | 2011-056634 A | * | 3/2011 |
| JP | 2011-140088 A | * | 7/2011 |
| JP | 2011-183477 A | | 9/2011 |
| JP | 2012-125879 A | * | 7/2012 |
| JP | 2014-008592 A | | 1/2014 |
| TW | 469203 B | | 12/2001 |
| WO | 2011/145390 A1 | | 11/2011 |
| WO | 2013/153691 A1 | | 10/2013 |

OTHER PUBLICATIONS

Machine translation of Japan Patent document No. 2012-125-879, Jun. 2018.*

Machine translation of Japan Patent document No. 2011-056,634-A, Jun. 2018.*

Communication dated Mar. 29, 2017, from the Intellectual Property Office of Taiwan in counterpart application No. 104130415.

Japanese Office Action issued in JP 2015-531394 dated Oct. 13, 2015.

Japanese Decision to Grant a Patent issued in JP 2015-531394 dated Jan. 19, 2016.

International Search Report of PCT/JP2014/075295 dated Jan. 13, 2015.

* cited by examiner

WIRE ELECTRICAL DISCHARGE MACHINING APPARATUS AND METHOD OF MANUFACTURING SEMICONDUCTOR WAFER

CROSS REFERENCE TO RELATED APPLICATIONS

This application is a National Stage of International Application No. PCT/JP2014/075295 filed Sep. 24, 2014, the contents of which are incorporated herein by reference in its entirety.

FIELD

The present invention relates to a wire electrical discharge machining apparatus that machines a workpiece by using electrical discharge energy generated between a wire and the workpiece and to a method of manufacturing a semiconductor wafer.

BACKGROUND

A device has been proposed that simultaneously cuts a columnar workpiece into sheet wafers by using a plurality of parallel cutting wire sections. One cutting method is a wire saw method in which a wafer is machined from a workpiece by using an abrasive action that involves pressing an abrasive material that is in between the cutting wire section and the workpiece against the surface of the workpiece or pressing a wire that has a surface to which is adhered hard microabrasive grains, e.g., diamond, against the surface of the workpiece. Besides the wire saw method, a method has been proposed called a wire electrical discharge machining method in which a machining power source is fed to each cutting wire section in order to generate electrical discharge between the cutting wire sections and the workpiece and the workpiece is thus removed by using the electrical discharge energy.

In order to increase productivity, a wafer machining apparatus employing each of the two types of machining methods described above includes a cutting wire section formed by repeatedly winding a single wire across a plurality of guide rollers to create a plurality of wires arranged in parallel with one another at regular intervals; therefore, the workpiece can be cut simultaneously at a plurality of sites.

CITATION LIST

Patent Literature

Patent Literature 1: Japanese Patent Application Laid-Open No. 2011-183477
Patent Literature 2: International Publication WO 2013/153691

SUMMARY

Technical Problem

Conventional machining methods such as the wire saw method or the wire electrical discharge machining method, which use the cutting wire section to simultaneously cut an ingot into a plurality of sheet wafers, are only intended to cut a columnar workpiece into wafers. This means that a machining mechanism in accordance with such a machining method cannot avoid generating warpage on the machined surface of the wafer or a machining-affected layer formed on a surface layer of the machined surface of the wafer. Consequently, a wafer formed by only cutting the columnar workpiece is not able to satisfy specifications making it acceptable to be used as a wafer in a semiconductor process in terms of wafer quality such as the thickness, surface roughness, and damage to the crystal structure. Therefore, for example, a wafer that is formed by a method such as a pulling method or a sublimation method in order to obtain the desired physical properties and that is cut from the ingot that is a semiconductor material needs to go through a post-process, such as grinding or polishing, in order to meet good machined surface quality so that the wafer can be used in a semiconductor process. The wafer being cut by the aforementioned method goes through the post-process and is finished as a wafer with a predetermined thickness and surface roughness such that it can be used in a semiconductor process.

Productivity of the wafers at the ingot cutting stage is greatly increased when the wafers that are obtained by simultaneously cutting the ingot, which is the workpiece, with a plurality of parallel wires. On the other hand, for each wafer being cut, a difference in the thickness caused by a difference in the amount of machining within the cut surface or a machining-affected layer caused by a fracture or thermal effects on the surface of the wafer causes an increase in the wafer machining load during grinding or polishing, which is the post-process. Therefore, when one considers comprehensively how a wafer satisfying a required end specification is obtained, there is problem in that wafer production efficiency is decreased depending on the wafer cutting conditions imposed by the cutting wire section.

For example, Patent Literature 1 proposes a method of preventing the deformation of each wafer due to the external force created during the aforementioned cutting when using a multi-wire electrical discharge machining method. According to Patent Literature 1, an elastic member is pressed against a machining start end of each of a number of wafers that are simultaneously being formed by the cutting wire section from the side of the machining start end of the wafers; therefore, the elastic member being deformed gets into each machined groove between the wafers to serve as filling between the wafers in order to fill the gaps between the adjacent wafers and thus prevent the wafers from moving.

However, the wafer can be deformed when the elastic member is pressed against the end of the wafer too much by using the method of cutting the ingot into wafers as disclosed in Patent Literature 1. In contrast, when the elastic member is pressed insufficiently, a gap remains in the space between the adjacent wafers; therefore, the wafers cannot be fixed securely. That is, it is difficult to adjust the amount of pressing. Moreover, when electrical discharge machining is performed on the end of the wafer filled with filling by a method of finishing the wafer by repeatedly scanning the cutting wire section while performing electrical discharge machining on each machined surface of the wafer being cut from the ingot, there is a problem in that the finishing cannot be performed because the cutting wire section interferes with the filling.

Patent Literature 2 contains a proposal describing that a parallel wire to which a machining power source is supplied performs scanning while performing electrical discharge machining through a slit between opposing wafers to perform finishing on the wafer surfaces being formed. In Patent Literature 2, a stage is provided that is used for relatively moving a workpiece in a direction perpendicular to a wire running direction of a cutting wire section. The relative movement of the workpiece is stopped before the cutting wire section completely finishes cutting the workpiece, and a parallel wire section is made to approach one side of the wafer surface formed on the workpiece by the stage on which the workpiece is placed. The difference in an interelectrode distance between the two opposing wafer surfaces and the wire positioned between the two wafer surfaces causes electrical discharge to occur preferentially on the wafer surface closer to the wire. The one side of the wafer surface is evenly subjected to electrical discharge machining when the wire performs scanning along the wafer surface in this state. The approaching action of the wire to the one side of the wafer surface is performed by the stage, and a scan path of the parallel wire that is different from a scan path at the time of cutting is used to allow one of the opposing wafer surfaces to be reliably subjected to electrical discharge machining. Note that while the method disclosed in Patent Literature 2 can reliably make shape correction by electrical discharge machining, the wafer is machined one surface at a time; therefore, a corresponding amount of time is required to complete the shape correction on the wafer.

The present invention has been made in view of the aforementioned problems, and an object of the present invention is to provide a wire electrical discharge machining apparatus with which machining accuracy and productivity of the semiconductor wafer can be improved.

Solution to Problem

In order to solve the above problem and attain the object, an aspect of the present invention is a wire electrical discharge machining apparatus that generates electrical discharge between a workpiece and a wire electrode and performs electrical discharge machining on the workpiece with energy due to the electrical discharge. The wire electrical discharge machining apparatus includes: a plurality of parallel wire sections that are formed by winding a piece of the wire electrode around a plurality of guide rollers and includes a region facing the workpiece; a pair of damping guide rollers that is provided in parallel with the guide rollers, follows the parallel wire sections so as to be in contact with the parallel wire sections, and forms a plurality of damped cutting wire sections within the parallel wire sections; a pair of wire pressing sections that is provided in parallel with and facing the pair of damping guide rollers across the parallel wire sections, presses the parallel wire sections against the pair of damping guide rollers, and follows the parallel wire sections to be in contact with the parallel wire sections; a power source to apply voltage across each of the parallel wire sections and the workpiece arranged to face the cutting wire sections; a moving unit to move the workpiece relative to the cutting wire sections in a direction at right angles to the cutting wire sections in a plane perpendicular to an axial direction of the guide roller; and a controller to control an operation of the wire electrical discharge machining apparatus. The controller controls: cutting of simultaneously cutting a plurality of wafers are cut simultaneously by performing the electrical discharge machining while moving the workpiece relative to the cutting wire sections in the direction at right angles to the cutting wire sections in the plane perpendicular to the axial direction of the guide roller and leaving a connection at which a part of each of the wafers that are incompletely cut is still connected to the workpiece; and shape correction of causing the cutting wire sections to perform scanning while performing electrical discharge machining along a path of the cutting wire sections in a cutting direction at a time of the cutting to simultaneously correct a shape of a plurality of cut surfaces that are cut at a time of the cutting.

Advantageous Effects of Invention

The wire electrical discharge machining apparatus according to the present invention has an effect whereby the machining accuracy and productivity of the semiconductor wafer can be improved.

BRIEF DESCRIPTION OF DRAWINGS

FIG. 6(a) is a cross-sectional view illustrating paths of the cutting wire sections in the cutting process of the first embodiment and FIG. 6(b) is a cross-sectional view illustrating an enlarged view of a machined area in FIG. 6(a).

FIG. 7(a) is a cross-sectional view illustrating paths of the cutting wire sections in the shape correction process of the first embodiment and FIG. 7(b) is a cross-sectional view illustrating an enlarged view of a machined area in FIG. 7(a).

DESCRIPTION OF EMBODIMENTS

A wire electrical discharge machining apparatus and a method of manufacturing a semiconductor wafer according to embodiments of the present invention will be described in detail with reference to the drawings. Note that the present invention is not to be limited by the embodiments.

First Embodiment

<Configuration of Wire Electrical Discharge Machining Apparatus>

Figure 1:
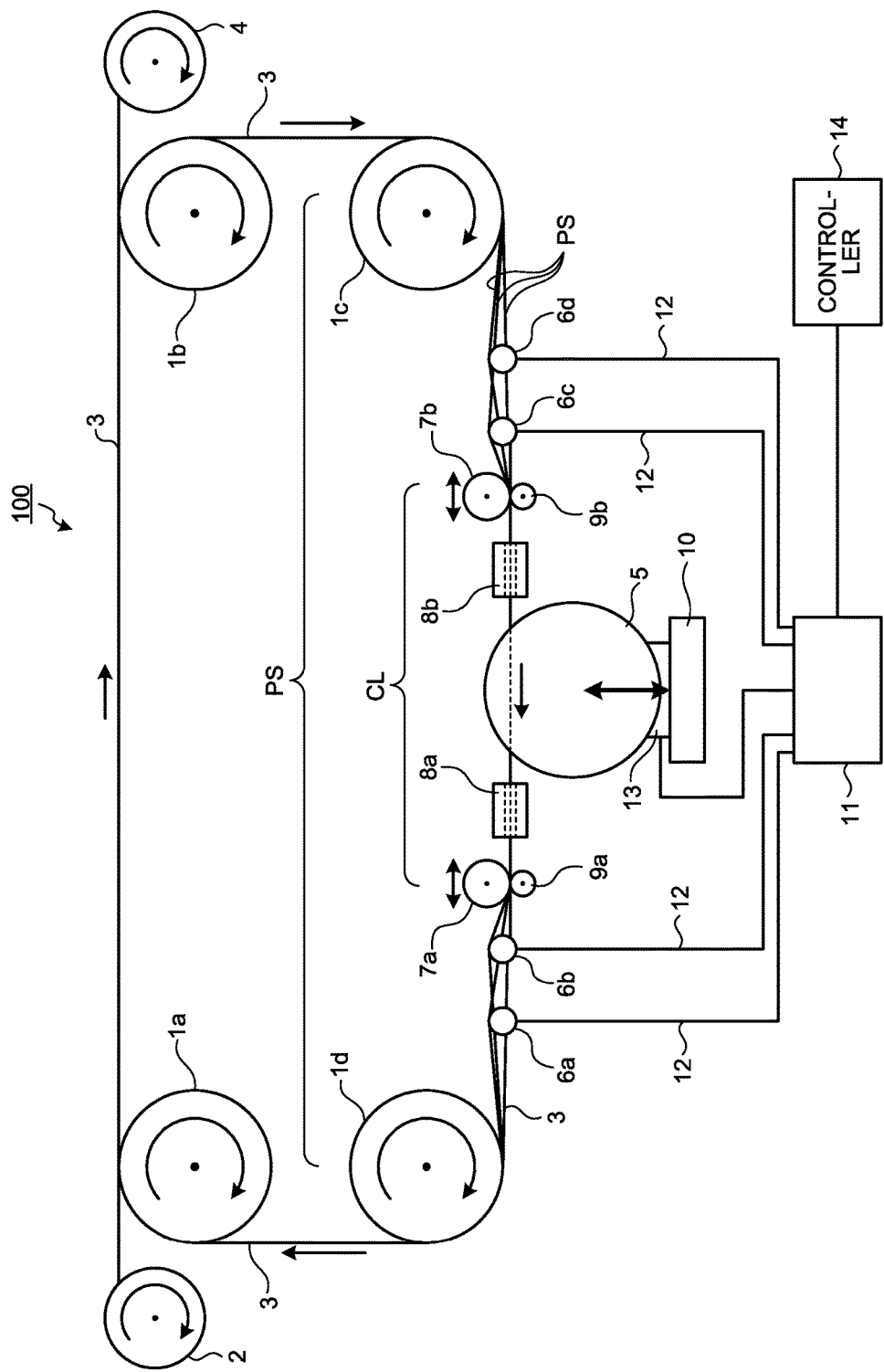
FIG. 1 is a side view illustrating the configuration of a principal part of a wire electrical discharge machining apparatus according to a first embodiment of the present invention.
Figure 2:
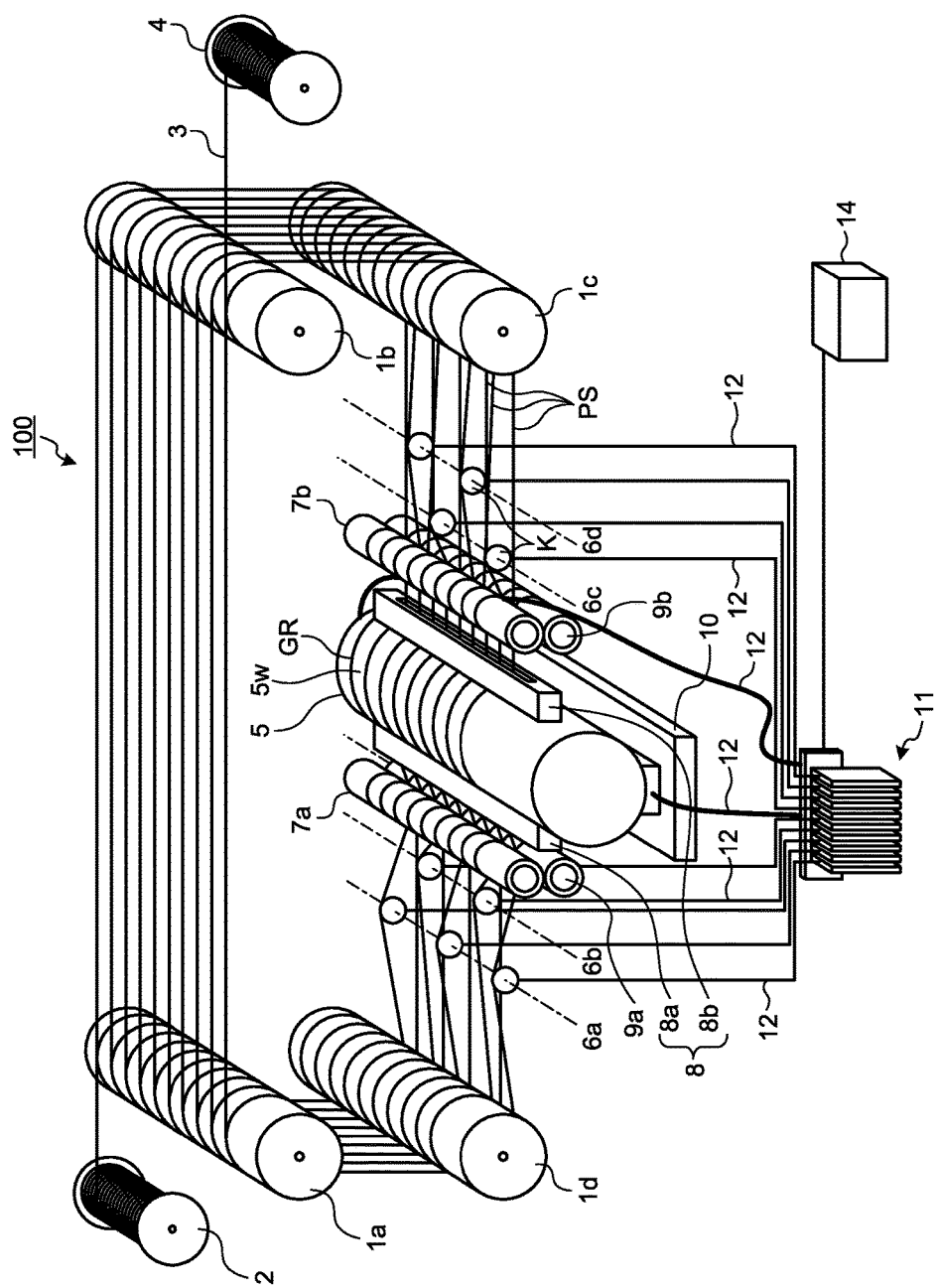
FIG. 2 is a perspective view illustrating the configuration of the principal part of the wire electrical discharge machining apparatus according to the first embodiment of the present invention.

FIG. 1 is a side view illustrating the configuration of a principal part of a wire electrical discharge machining apparatus 100 according to a first embodiment of the present invention. FIG. 2 is a perspective view illustrating the configuration of the principal part of the wire electrical discharge machining apparatus 100 according to the first embodiment of the present invention. In the wire electrical discharge machining apparatus 100 according to the first embodiment of the present invention, four main guide rollers 1a to 1d make up a wire running system.

The wire electrical discharge machining apparatus 100 includes the main guide rollers 1c and 1d, which are a pair of guide rollers arranged in parallel at an interval, and a single wire 3 that is wound around the pair of main guide rollers 1c and 1d a plurality of times while being separated by a fixed pitch to form parallel wire sections PS between the pair of main guide rollers 1c and 1d and that runs with the rotation of the main guide rollers 1c and 1d. That is, the single wire 3 is wound around the main guide rollers 1c and 1d to form a plurality of parallel wire sections including an area facing a workpiece 5. The wire 3 functions as a wire electrode in the wire electrical discharge machining apparatus 100. In the first embodiment, a cylindrical semiconductor ingot made of a semiconductor material is used as the workpiece 5.

The wire electrical discharge machining apparatus 100 further includes a pair of damping guide rollers 7a and 7b that is provided in parallel with the pair of main guide rollers 1c and 1d between the main guide rollers 1c and 1d and follows the parallel wire sections PS so as to be in contact therewith and form a plurality of damped cutting wire sections CL, and a pair of wire pressing sections 9a and 9b that is provided in parallel with the pair of damping guide rollers 7a and 7b while facing them across the parallel wire sections PS and presses the parallel wire sections PS against the pair of damping guide rollers 7a and 7b to follow the parallel wire sections PS and to be in contact therewith.

The wire electrical discharge machining apparatus 100 further includes a power source that applies a voltage across the workpiece 5 that is arranged such that it faces the cutting wire sections CL and each of the parallel wire sections PS; an ascending/descending stage 10 that is a moving unit that moves the workpiece 5 relative to the cutting wire sections CL in a direction at right angles to the cutting wire sections CL in a plane perpendicular to an axial direction of each of the main guide rollers 1a to 1d; and a controller 14 that controls the driving of each component of the wire electrical discharge machining apparatus 100 in order to execute a function of the wire electrical discharge machining apparatus 100.

The cutting wire section CL includes a function of moving the workpiece 5 relative to the cutting wire section CL and simultaneously cutting the workpiece 5 into a plurality of wafers by using electrical discharge energy generated between the workpiece 5 and the cutting wire section, and a function of moving the workpiece 5 relative to the cutting wire section CL along a path of the cutting wire section CL at the time of the cutting and performing shape correction simultaneously on both surfaces of the wafer that has been incompletely cut by using the electrical discharge energy generated between the workpiece 5 and the cutting wire section.

The main guide rollers 1a to 1d are principal guide rollers making up the wire running system. In the wire electrical discharge machining apparatus 100, the four main guide rollers 1a to 1d having the same diameter are arranged in parallel with one another at intervals. The single wire 3 fed from a wire feeding bobbin 2 extends across the four main guide rollers 1a to 1d one by one to be repeatedly wound around the rollers, namely wrapped around the rollers, while being separated at a fixed interval in the axial direction of each of the four main guide rollers 1a to 1d. The wire 3 runs with the rotation of the main guide rollers 1a to 1d and is taken up by a wire take-up bobbin 4 at the end.

The main guide rollers 1c and 1d are installed at positions such that the workpiece 5 is interposed therebetween. The wire 3 is stretched across the main guide roller 1c and the main guide roller 1d with a fixed tension to make up the parallel wire sections PS separated from one another in the axial direction of each of the main guide rollers 1c and 1d. Note that in the specification, the parallel wire section PS refers to a section of the wire 3 wound around the main guide rollers 1a to 1d, the section being from where the wire 3 is fed from the main guide roller 1c to where the wire 3 is wound around the main guide roller 1d. That is, the parallel wire section PS corresponds to the section of the wire 3 between a shaft of the main guide roller 1c and a shaft of the main guide roller 1d in a running direction of the wire 3 fed from the main guide roller 1c.

The cutting wire section CL is a linearly-stretched area of the parallel wire section PS that includes a section facing the workpiece 5 to be used for cutting the workpiece 5. That is, the cutting wire section CL is a section of the parallel wire section PS between a shaft of the damping guide roller 7a and a shaft of the damping guide roller 7b. FIG. 1 illustrates a state in which cutting of the workpiece 5 is started with the cutting wire section CL advancing through the workpiece 5. The wires 3 are arranged in parallel with one another at a fixed interval in the cutting wire sections CL; therefore, a plurality of the wafers 5w can be cut simultaneously from the workpiece 5. Note that in the following description, the wafer 5w includes a wafer that has been incompletely cut.

Each of power feed contact units 6a to 6d, which supply a voltage pulse from a power supply unit 11 individually to the wires 3 of the cutting wire sections CL, is individually arranged so as to be in contact with the wires 3 of the parallel wire sections PS. Power is supplied individually to the wire 3 of each parallel wire section PS to provide stable electrical discharge machining by all the parallel wire sections PS. FIG. 1 illustrates four units including the power feed contact units 6a and 6b arranged between the main guide roller 1d and the workpiece 5 and the power feed contact units 6c and 6d arranged between the main guide roller 1c and the workpiece 5.

Each of the power feed contact units 6a to 6d, which are power sources, is an aggregate of a plurality of power feed contacts K arrayed along the axial direction of each of the main guide rollers 1a to 1d at the same interval as the wires 3 being wound. The power feed contacts K are insulated from one another. The power feed contacts K respectively supply power to the cutting wire sections CL, through which machining current flows. A V-groove wire guide is formed on the surface of the power feed contact K, a cross section of which along the direction of extension of the parallel wire sections PS, namely along the direction of running of the wires 3, has the shape of a circle or an arc. The power feed contact K is rotatably installed so as to be able to change an area in contact with the wire by being periodically rotated. On the other hand, a terminal of the power supply unit 11, which is the power source, is electrically connected to each of the power feed contact units 6a to 6d on the power feeding side and is electrically connected to the workpiece 5 on the ground side. This allows the voltage pulse output from the power supply unit 11 to be applied between the wires 3 of the cutting wire sections CL and the workpiece 5. The power supply unit 11 and the power feed contacts K and the workpiece 5 are electrically connected by feeders 12. Note that, in FIG. 1, the power supply unit 11 and the workpiece 5 are electrically connected to each other via a conductive holding member 13 that holds and fixes the workpiece 5 on the ascending/descending stage 10.

Moreover, the damping guide rollers 7a and 7b are arranged on the parallel wire sections PS between the power feed contact unit 6b and the power feed contact unit 6c. The damping guide rollers 7a and 7b guide the wires 3 while keeping the wires 3 wound around the rollers at all times. The damping guide rollers 7a and 7b are guide rollers that are provided between the pair of main guide rollers 1c and 1d, that follow the parallel wire sections PS so as to be in contact therewith, and that have smaller diameters than those of the main guide rollers 1c and 1d. That is, the damping guide rollers 7a and 7b are following guide rollers arranged in contact with the parallel wire sections PS such that the wires 3 are wound around the rollers, and are rotated while following the running of the wires 3. The damping guide rollers 7a and 7b then support the wires 3 and form the cutting wire sections CL that are the linearly stretched wires 3. As described later, the cutting wire sections CL between the damping guide rollers 7a and 7b are almost fixed in the running position as vibration of the wires is damped.

Also arranged in the area of the cutting wire sections CL are nozzles 8a and 8b, which are nozzles 8 facing each other and between which the workpiece 5 is interposed. The nozzles 8a and 8b emit machining fluid toward a cut portion of the workpiece 5 along the cutting wire sections CL. The cutting wire sections CL are arranged to pass through the nozzles 8a and 8b but are not in contact with an inner surface of each of the nozzles 8a and 8b. The ascending/descending stage 10 is a stage that ascends or descends with the workpiece 5 placed thereon, and moves the workpiece 5 relative to the cutting wire sections CL. An arrow drawn from the ascending/descending stage 10 in FIG. 1 indicates the direction in which the ascending/descending stage 10 moves.

The wires 3 are wound around approximately a quarter of the circumference of each of the main guide rollers 1a to 1d, namely around only a part of each roller, and go around the four main guide rollers 1a to 1d. The main guide rollers 1a to 1d make up a path from the wire feeding bobbin 2 to the wire take-up bobbin 4 and are configured to secure space for the workpiece 5 to pass through the cutting wire sections CL but not to interfere with the rest of the wires. The main guide rollers 1c and 1d are driven guide rollers. The main guide rollers 1a and 1b arranged above the main guide rollers 1c and 1d are following guide rollers. The driven guide roller is rotated to be driven by a motor connected to a shaft of the roller. On the other hand, the following guide roller does not generate a driving force but is rotated with the running of the wires 3 that are in contact with the surface of the roller. A black dot drawn at the center of each of the main guide rollers 1a to 1d in FIG. 1 indicates the shaft. Moreover, an arrow drawn around the shaft of each of the main guide rollers 1a to 1d in FIG. 1 indicates the direction of rotation of each of the main guide rollers 1a to 1d. Arrows drawn along the wire 3 in FIG. 1 indicate the direction of running of the wire 3.

Each of the main guide rollers 1a to 1d is a roller formed by wrapping a rubber material such as urethane rubber around a cylindrical core metal, both ends of which are each supported by a bearing to allow the roller to be rotated. The rubber on the surfaces of the main guide rollers 1a to 1d has a high coefficient of friction with the wires 3 and is thus suitable for preventing the wires 3 from sliding and idling on the main guide rollers 1a to 1d. Moreover, the surface of each of the main guide rollers 1a to 1d in contact with the wires 3 includes a plurality of grooves formed at the same interval as that of the wires being wound in the axial direction of each of the main guide rollers 1a to 1d. The wires 3 are wound along the grooves so as to be able to keep a fixed interval of the wires 3 of the cutting wire sections CL. The distance between the cutting wire sections CL arranged in parallel with each other at regular intervals in the axial direction of the main guide rollers 1a to 1d, namely the winding interval of the wires 3 on the main guide rollers 1a to 1d, is fixed and is approximately 0.1 mm to 0.8 mm when a semiconductor wafer is to be cut.

The force of pulling the wires 3 can be obtained from the driven main guide rollers 1c and 1d, while the force of rotating the roller can be obtained from the following main guide rollers 1a and 1b. These guide rollers 1c and 1d, the power feed contact units 6a to 6d, the damping guide rollers 7a and 7b, the nozzles 8a and 8b, and the workpiece 5 are immersed in the machining fluid stored in a machining fluid storage tank, which is not illustrated, where the cutting wire sections CL face the workpiece 5 in the machining fluid and perform cutting simultaneously.

Moreover, the grooves are formed at the same interval as that of the wires being wound on each surface of the main guide rollers 1a to 1d; therefore, the interval of the wires 3 can remain fixed in the cutting wire sections CL with the wires 3 passing through the grooves. The interval of the wires 3 in the cutting wire sections CL can be set according to the purpose. When it is aimed at cutting a semiconductor wafer as in the first embodiment, it is appropriate to set the interval of the wires 3 in the cutting wire sections CL along the axial direction of each of the main guide rollers 1a to 1d to approximately 0.1 mm to 0.8 mm.

The damping guide rollers 7a and 7b are the following guide rollers arranged in contact with the wires 3 of the parallel wire sections PS such that the wires 3 are wound around the rollers, and are rotated by following the running of the wires 3. The damping guide rollers 7a and 7b are the following guide rollers having higher shape accuracy, rotational accuracy, and mounting accuracy than the main guide rollers 1a to 1d, and are arranged at two positions such that the workpiece 5 is interposed between the rollers in the direction of extension of the parallel wire sections PS. The damping guide rollers 7a and 7b are pressed against the parallel wire sections PS being stretched and are arranged such that the wires 3 of the parallel wire sections PS are brought into contact with a part of the circumference of the damping guide rollers 7a and 7b. This allows the wires 3 between the damping guide rollers 7a and 7b to be stretched linearly as well as the direction of running of the wires 3 to be bent, whereby the wires 3 remain wound around the damping guide rollers 7a and 7b at all times while the wires 3 are running.

The wires 3 vibrating before being wound around the damping guide roller 7b are securely wound around the damping guide roller 7b, which performs damping by suppressing the vibration of the wires 3 running while vibrating. Likewise, the vibration applied to the wires 3 sent out from the damping guide roller 7b is suppressed by the damping guide roller 7a and damped. As a result, the two damping guide rollers 7a and 7b create a state with almost no wire vibration in a linear region between the two damping guide rollers 7a and 7b while following the running of the wires and being rotated by the frictional force with the wires 3. That is, the damping guide rollers 7a and 7b suppressing propagation of vibration from the main guide rollers to the cutting wire sections CL can precisely guide the wires 3 such that a microscopic running position thereof is fixed. A left-right arrow drawn above each of the damping guide rollers 7a and 7b in FIG. 1 indicates the direction in which the damping guide rollers 7a and 7b can move.

Figure 3:
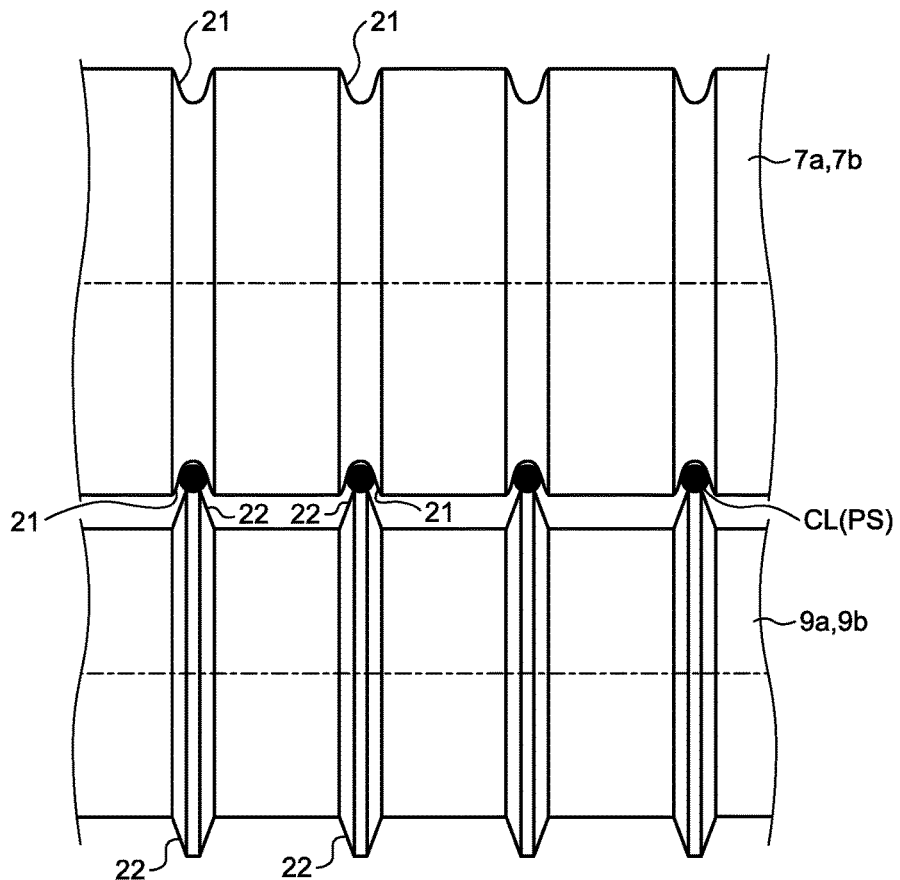
FIG. 3 is a side view illustrating the structure of each of a damping guide roller and a wire pressing section as well as how a cutting wire section is restrained according to the first embodiment of the present invention.

The damping guide rollers 7a and 7b can bend the direction of running of the wires 3 stretched in the cutting wire sections CL but do not have a function of securing the space for the workpiece 5 to pass through the cutting wire sections CL. Formed at a regular interval on the surface of each of the damping guide rollers 7a and 7b in contact with the wires 3 are wire guide grooves 21 that are grooves provided to guide the wires and that have a V-shaped cross section, namely a cross-sectional shape with the width narrowing toward the bottom from the surface of the roller, when being cut along a plane that is in parallel with the shaft of each of the damping guide rollers 7a and 7b and overlaps with the shaft. The wire guide grooves 21 are formed at an interval equal to the interval at which the cutting wire sections CL are arranged along the axial direction of the damping guide rollers 7a and 7b. Moreover, the wire guide grooves 21 are formed along a plane perpendicular to the shaft of each of the damping guide rollers 7a and 7b on a circumferential surface of each of the damping guide rollers 7a and 7b. The wire 3 is wound around each wire guide groove 21, one in every groove, thereby making up the cutting wire sections CL simultaneously cutting the workpiece 5. The damping guide rollers 7a and 7b can be moved in the direction of extension of the cutting wire sections CL. FIG. 3 is a side view illustrating the structure of each of the damping guide rollers 7a and 7b and wire pressing sections 9a and 9b as well as how the cutting wire sections CL are restrained.

The wire pressing sections 9a and 9b press each wire 3 making up the cutting wire section CL against the inner surface of the wire guide groove 21 formed on each surface of the damping guide rollers 7a and 7b in order to prevent a wire electrode from shifting in position within the wire guide groove 21; therefore, in the shape correction performed on a plurality of the wafers 5w to be described later, the interelectrode distance between the two wafer surfaces facing each other, namely the cut surfaces, and the wire 3 between the two wafer surfaces is identical to the interelectrode distance at the time of cutting.

In a similar manner to the damping guide rollers 7a and 7b, the wire pressing sections 9a and 9b are following guide rollers having high shape accuracy, rotational accuracy, and mounting accuracy, and are arranged in parallel with the damping guide rollers 7a and 7b at positions facing the damping guide rollers 7a and 7b across the parallel wire sections PS. That is, the wire pressing section 9a is arranged in parallel with the damping guide roller 7a at a position facing the damping guide roller 7a across the parallel wire sections PS. The wire pressing section 9b is arranged in parallel with the damping guide roller 7b at a position facing the damping guide roller 7b across the parallel wire sections PS.

Formed on the circumferential surface of each of the wire pressing sections 9a and 9b at a regular interval identical to the interval at which the cutting wire sections CL are arranged are wire pressing protrusions 22 that are protrusions having an inverted V-shaped cross section, namely a cross-sectional shape with the width narrowing toward the apex from the circumferential surface, when being cut along a plane that is in parallel with the shaft of each of the wire pressing sections 9a and 9b and overlaps with the shaft. The wire pressing protrusions 22 are cut from the material of the wire pressing sections 9a and 9b such that they are molded integrally with the wire pressing sections 9a and 9b. Moreover, the wire pressing protrusions 22 are formed along a plane perpendicular to the shaft of each of the wire pressing sections 9a and 9b on the circumferential surface of each of the wire pressing sections 9a and 9b. The wire pressing sections 9a and 9b are installed such that the wire pressing protrusions 22 are fitted into the wire guide grooves 21 of the damping guide rollers 7a and 7b. The amount of pressing applied by the wire pressing sections 9a and 9b is then adjusted such that the wire pressing protrusions 22 on the wire pressing sections 9a and 9b press each wire 3 toward the bottom of the wire guide groove 21, the wire 3 making up the cutting wire section CL wound along the wire guide groove 21 of the damping guide rollers 7a and 7b. The wire pressing sections 9a and 9b are the following rollers that rotate by following the running of the wires 3 with the wire pressing protrusions 22 being brought into contact with the wires 3 of the parallel wire sections PS.

The wire pressing protrusions 22 on the circumferential surfaces of the wire pressing sections 9a and 9b press the cutting wire sections CL against the inner walls of the wire guide grooves 21 formed on the damping guide rollers 7a and 7b, whereby the cutting wire sections CL do not shift in position within the wire guide grooves 21 but remain in contact with the wire guide grooves 21 even when there is a change in the flow of the machining fluid or when wire running is suspended and then resumed. This allows the damping guide rollers 7a and 7b and the wire pressing sections 9a and 9b to be rotated with the running of the cutting wire sections CL without sliding.

The shape and dimensions of the wire pressing protrusions 22 can be modified as appropriate according to the shape and dimensions of the wire guide grooves 21 as long as the cutting wire sections CL in the wire guide grooves 21 are pressed against the inner walls of the wire guide grooves 21 on the damping guide rollers 7a and 7b by the wire pressing protrusions 22 on the wire pressing sections 9a and 9b to prevent shifting in position of the cutting wire sections CL within the wire guide grooves 21 as described above. Moreover, it is not necessary that the shaft of the wire pressing section 9a and the shaft of the damping guide roller 7a are arranged at the same position along the direction of extension of the cutting wire sections CL as long as the wire pressing protrusions 22 on the wire pressing sections 9a and 9b can press the cutting wire sections CL against the inside of the wire guide grooves 21 on the damping guide rollers 7a and 7b as described above. That is, the wire pressing section 9a and the damping guide roller 7a may be out of alignment in the direction of extension of the cutting wire sections CL. Likewise, it is not necessary that the shaft of the wire pressing section 9b and the shaft of the damping guide roller 7b are arranged at the same position along the direction of extension of the cutting wire sections CL. That is, the wire pressing section 9b and the damping guide roller 7b may be out of alignment in the direction of extension of the cutting wire sections CL.

The controller 14 can control driving of each component of the wire electrical discharge machining apparatus 100 by using a numerical control function. Note that the controller 14 is connected only to the power supply unit 11 in FIG. 1 but is actually connected to each component of the wire electrical discharge machining apparatus 100, each component being a control target.

Figure 4:
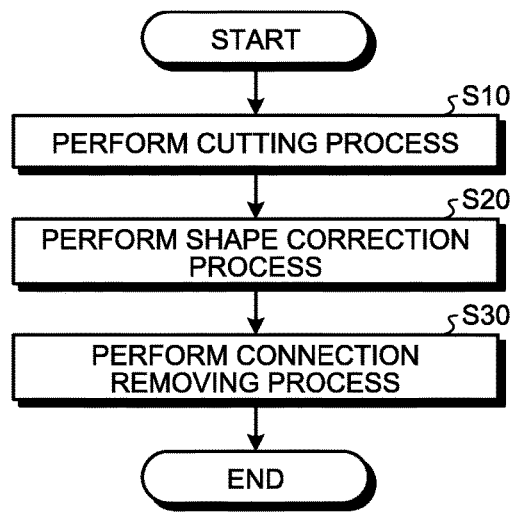
FIG. 4 is a flowchart illustrating a process of a method of manufacturing a semiconductor wafer by using the wire electrical discharge machining apparatus according to the first embodiment of the present invention.

Next, a method will be described of manufacturing a semiconductor wafer in which the wire electrical discharge machining apparatus 100 according to the first embodiment is used to simultaneously cut the cylindrical semiconductor ingot, which is the workpiece 5, into the semiconductor wafers (hereinafter referred to as wafers in some cases) 5w. FIG. 4 is a flowchart illustrating a process of the method of manufacturing semiconductor wafers by using the wire electrical discharge machining apparatus 100. Each process will now be described.

When the wire electrical discharge machining apparatus 100 is used to manufacture a semiconductor wafer, a cutting process is performed at step S10 in which cutting is performed to simultaneously cut the workpiece 5 into the wafers 5w by electrical discharge machining while leaving connections 5a at each of which a part of the wafer 5w that has been incompletely cut is connected to the workpiece 5. Next, a shape correction process is performed at step S20 in which the cutting wire sections CL perform scanning while performing electrical discharge machining along the paths of the cutting wire sections CL in the direction of cutting at the time of the cutting, and the shape of a plurality of cut surfaces being cut at the time of the cutting is simultaneously corrected. A connection removing process is then performed at step S30 in which the connections 5a are removed after the shape correction process.

With the method of manufacturing a semiconductor wafer according to the first embodiment, the aforementioned processes are performed in order to be able to simultaneously produce a plurality of semiconductor wafers from the ingot or the like, which is a bulk crystal of a semiconductor material. Each process will now be described. Note that cutting in the following description means machining performed during the cutting process.

<Cutting Process>

First, the cutting process is performed at step S10. The wire electrical discharge machining is performed to cut the workpiece 5 by generating arc discharge in a minute discharge gap between the wire 3 and the workpiece 5 immersed in a machining fluid, such as deionized water. Specifically, a part of the workpiece 5 heated by the arc being generated vaporizes once the temperature reaches the melting point of the workpiece 5 or higher. The machining fluid in the discharge gap then vaporizes explosively, and the vaporized machining fluid blows off the molten part of the workpiece 5. The part being blown off becomes machining waste and floats in the machining fluid. As each of the cutting wire section CL and the workpiece 5 is a discharge electrode, the length of the discharge gap is also referred to as the interelectrode distance.

During the machining, the wire 3 is continuously fed from the wire feeding bobbin 2, runs by the rotation of the main guide rollers 1a to 1d, and is collected by the wire take-up bobbin 4. Tension in the parallel wires 3 running is controlled by adjusting the rotational speed of each of the wire feeding bobbin 2 and the wire take-up bobbin 4. The tension in the wires 3 running is kept constant when the running state of the wires 3 is stable.

During the electrical discharge machining, the main guide rollers 1c and 1d are rotated to run the wires 3 while at the same time the workpiece 5 is arranged to face the cutting wire sections CL at a specified interelectrode distance away therefrom. The voltage pulse as the machining power source is then applied from the power supply unit 11 to the cutting wire sections CL to generate a pulse discharge between the cutting wire sections CL and the workpiece 5, and the ascending/descending stage 10 is moved upward in accordance with the cutting speed. The arc discharge is made to continue while the cutting wire sections CL and the workpiece 5 are moved relative to each other with the interelectrode distance kept constant; therefore, machined grooves GR are formed in the workpiece 5, where the grooves correspond to the paths of the cutting wire sections CL passing through the workpiece 5. As a result, the thickness of the wafers 5w being cut equals the length obtained by subtracting, from the winding interval of the wires 3, the machining width, namely, the width of the machined grooves GR that is the cut width of the workpiece 5. It is preferable that the wire diameter of the wires 3 be small in order to reduce the machining width. Practically, a steel wire with the wire diameter of approximately 0.1 mm, more preferably a steel wire with the wire diameter further reduced to approximately 0.07 mm is appropriate as the wires 3. Moreover, in order to have an appropriate discharge starting voltage, a brass coating or the like may be applied to the surface of the steel wire.

The power feed contact units 6a and 6d are provided with a moving mechanism (not illustrated) that moves the power feed contact units 6a to 6d in a direction perpendicular to the parallel wire sections PS in order to adjust the amount of pressing against the parallel wire sections PS. The length of contact between the wire 3 of the parallel wire section PS and the power feed contact K corresponds to a sliding length, which can be managed by the amount of pressing of the power feed contact units 6a to 6d against the parallel wire sections PS. That is, the sliding length is short when the amount of pressing is small and long when the amount of pressing is large. The amount of pressing may be specified by the distance by which the power feed contact unit is pushed into the parallel wire section PS or by a pressing force. Contact resistance between the power feed contact units 6a to 6d and the parallel wire sections PS can be adjusted by adjusting the sliding length, and a fine adjustment can be made to a discharge current value per voltage pulse. Note that a machining current value is of course fed to each cutting wire section CL via the power feed contact units 6a to 6d and can thus be adjusted by adjusting the machining power source.

An example of a cutting condition for cutting the semiconductor ingot, which is the workpiece 5, with use of the wire electrical discharge machining apparatus 100 includes having an applied voltage of 100 V, a machining current of 3 A to 4 A, and a pulse width of 0.6 μsec. However, the cutting condition is not particularly limited and can be used by making an adjustment as appropriate according to conditions, such as the type and thickness of the wires 3 being used and the material of the workpiece 5.

Figure 5:
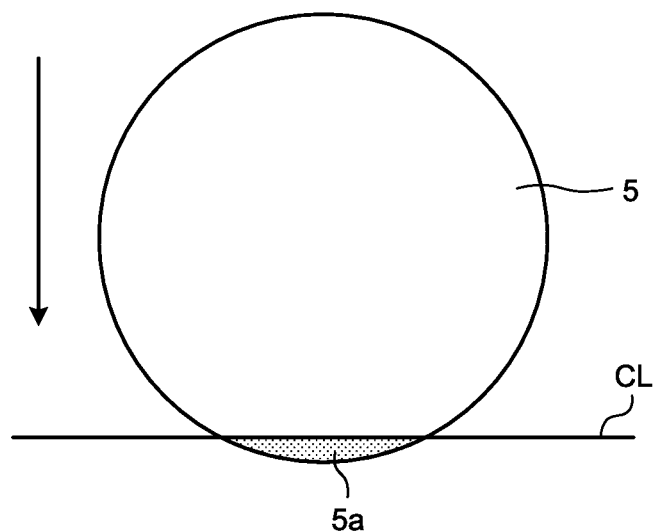
FIG. 5 is a schematic diagram illustrating the position of the cutting wire section when cutting of a workpiece is suspended according to the first embodiment of the present invention.

Then, in the cutting process, the workpiece 5 is cut by the wire electrical discharge machining apparatus 100, which suspends the cutting before the wafers 5w are completely cut. That is, the cutting is performed to leave the connections 5a at each of which a part of the wafer 5w that has been incompletely cut is connected to the workpiece 5 without completely cutting the wafers 5w. Specifically, the workpiece 5 is cut incompletely in the diameter direction of the workpiece 5 as illustrated in FIG. 5, then the cutting process is suspended at a position at which the connections 5a remain. FIG. 5 is a schematic diagram illustrating the position of the cutting wire sections CL when cutting of the workpiece 5 is suspended according to the first embodiment. FIG. 5 illustrates a cross section perpendicular to an axis of the workpiece 5. An arrow in FIG. 5 indicates the direction in which the workpiece 5 is cut by the cutting wire sections CL. The cutting is suspended at a position at which 1 mm of the connections 5a remain in the cutting direction before the wafers 5w are completely cut, for example. However, the thickness of the connections 5a is not limited to 1 mm as long as the connections 5a by which the wafers 5w that have been incompletely cut can support themselves remain to allow the part of each of the wafers 5w that have been incompletely cut to be connected to the workpiece 5.

<Shape Correction Process>

Figure 6:
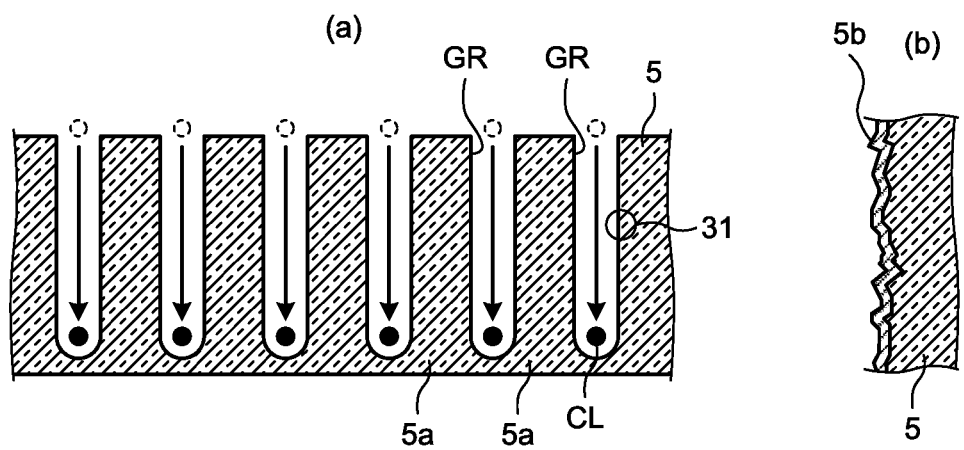
FIG. 6 is a cross-sectional view illustrating a cutting process of the first embodiment of the present invention, where
Figure 7:
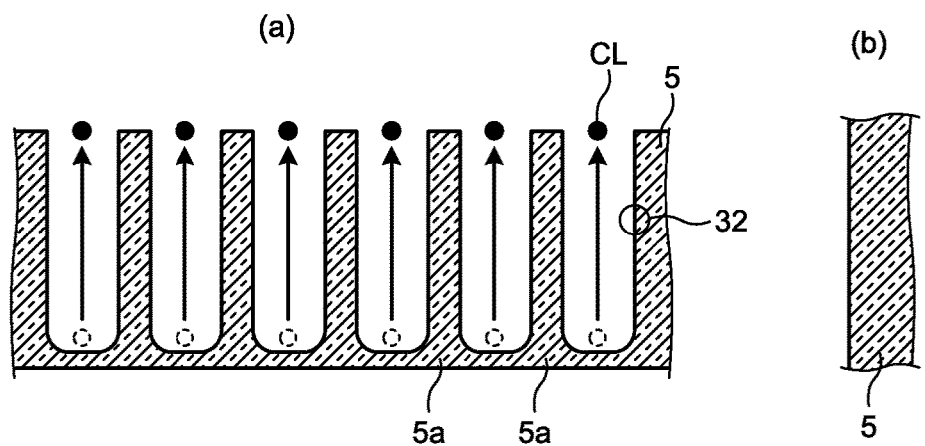
FIG. 7 is a cross-sectional view illustrating a shape correction process of the first embodiment of the present invention, where

Next, there will be a description of the shape correction performed at step S20 on the wafers 5w that have been incompletely cut in the cutting process in order to have the connections 5a connected to the workpiece 5. FIG. 6 is a cross-sectional view illustrating the cutting process of the first embodiment, where FIG. 6(a) is a cross-sectional view illustrating paths of the cutting wire sections CL in the cutting process of the first embodiment and FIG. 6(b) is a cross-sectional view illustrating an enlarged view of a machined area 31 in FIG. 6(a). Dotted circles and black circles in FIG. 6(a) indicate a cross section of the wires 3 of the cutting wire sections CL, where the dotted circles correspond to the machining start position of the cutting process and the black circles correspond to the machining end position of the cutting process. FIG. 7 is a cross-sectional view illustrating the shape correction process of the first embodiment, where FIG. 7(a) is a cross-sectional view illustrating paths of the cutting wire sections CL in the shape correction process of the first embodiment and FIG. 7(b) is a cross-sectional view illustrating an enlarged view of a machined area 32 in FIG. 7(a). Dotted circles and black circles in FIG. 7(a) indicate a cross section of the wires 3 of the cutting wire sections CL, where the dotted circles correspond to the machining start position of the shape correction process and the black circles correspond to the machining end position of the shape correction process. Note that the machining start position of the shape correction process illustrated in FIG. 7(a) corresponds to the machining end position of the cutting process. Arrows in each of FIGS. 6(a) and 7(a) indicate the paths of the cutting wire sections CL, i.e., pathways along which the cutting wire sections CL pass. While FIGS. 6(a) and 7(a) illustrate the cutting wire sections CL as if they undergo a movement, it is the semiconductor ingot, which is the workpiece 5, that is actually moved, where the cutting wire sections CL move relatively through the cut portion of the workpiece 5.

As described above, the pulse voltage, as the machining power source, is supplied to the cutting wire sections CL to generate the pulse discharge between each cutting wire section CL and the workpiece 5 and to move each cutting wire section CL relative to the workpiece 5. This results in a plurality of slits, namely the machined grooves GR, machined as illustrated in FIG. 6(a) in the part of the workpiece 5 through which each cutting wire section CL passes. A sheet, namely the wafer 5w that has been incompletely cut, is formed in a part interposed between the adjacent machined grooves GR. Once the workpiece 5 is cut completely by continuing the cutting, the part interposed between the machined grooves GR is simultaneously separated into a plurality of sheets. As a result, wafers for use in a semiconductor device are manufactured from the workpiece 5 made of the semiconductor material.

When machining is stopped before the cutting wire sections CL completely cut the workpiece 5 in the cutting process, the paths of the cutting wire sections CL remain as the machined grooves GR in the workpiece 5 as illustrated in FIG. 6(a). In the shape correction process, the machining power source is supplied to the cutting wire sections CL once again to perform electrical discharge machining through the machined grooves GR while the sheets formed between the machined grooves GR, namely the wafers 5w that have been incompletely cut, are not completely separated, and the paths of the cutting wire sections CL moved relative to the workpiece 5 in the cutting, namely the paths of the wires 3, are used to cause the cutting wire sections CL to perform scanning in a direction opposite to the paths as illustrated in FIG. 7(a). Alternatively, while the sheets formed between the machined grooves GR, namely the wafers 5w that have been incompletely cut, are not completely separated, the cutting wire sections CL are returned to the machining start position of the cutting process without supplying the machining power source to the cutting wire sections CL. Then, along the same paths of the cutting wire sections CL as those when the cutting process is performed, the cutting wire sections CL perform scanning while performing electrical discharge machining through the machined grooves GR with the machining power source supplied to the cutting wire sections CL. That is, in the shape correction process, the cutting wire sections CL perform scanning once again along the paths of the cutting wire sections CL used in the cutting process while performing electrical discharge machining through the machined grooves GR.

The sheet for which the cutting is suspended has an uneven portion 5b that is thickened with an uneven thickness as illustrated in FIG. 6(b) resulting from a condition such as an area remaining, namely an area left uncut in the previous cutting, or warpage of the sheet. Moreover, when the workpiece 5 is left as is after being cut by electrical discharge machining, a machining-affected layer is formed in a surface layer portion of the cut surface. The cutting wire section CL receives the machining power source in order to perform scanning on such a sheet by using the path of the wire 3 of the cutting wire section CL at the time the workpiece 5 is cut, i.e., the path of the cutting wire section CL at the time the workpiece 5 is cut. This causes a decrease in the interelectrode distance between each wire 3 making up the cutting wire section CL and the cut surface of the sheet to generate electrical discharge in the uneven portion 5b thickened with an uneven thickness due to, for example, a part remaining within the surface of the sheet; therefore, the part left uncut on the cut surface of the sheet is removed as illustrated in FIG. 7(b) and the shape of the cut surface of the sheet is thus corrected. Unevenness in the thickness of the sheet is corrected as a result.

When the position of the cutting wire section CL in the shape correction process shifts even slightly from the position at the time of the cutting process, the cutting wire section CL performs scanning while moving not in alignment with the path at the time of the cutting process even when the controller performs control on the scanning of the cutting wire section CL such that the cutting wire section CL moves along the same path as that at the time of the cutting process. In such a state, the cutting wire section CL is closer to one of the two cut surfaces of two sheets corresponding to each cutting wire section CL and is further away from the other cut surface, where the two cut surfaces of the two sheets face each other while the cutting wire section CL is interposed therebetween. This causes a difference between the interelectrode distances, which are originally equal, between the wire and each of the two cut surfaces; therefore, the cut surface having the shorter interelectrode distance with the wire 3 being even slightly closer thereto experiences electrical discharge more frequently or is subjected to electrical discharge machining more frequently. Accordingly, the shape correction on the cut surface performed by electrical discharge machining is not performed equally on the opposing cut surfaces, where only one of the cut surfaces is machined more.

When there is a change in at least one of the magnitude and the direction of the force that acts on each cutting wire section CL during the cutting process and presses the cutting wire section CL against the wire guide groove 21 in the damping guide rollers 7a and 7b and if the pressing force exceeds the frictional force between the cutting wire section CL and the wire guide groove 21 in the damping guide rollers 7a and 7b, the cutting wire section CL moves within the wire guide groove 21 and shifts from the position of the cutting wire section CL at the time of the cutting, whereby shifting of the cutting wire section CL described above is generated.

The force of pressing the wires 3 against the damping guide rollers 7a and 7b is the tension of the cutting wire sections CL and is controlled within a specified set range despite any disturbance during machining by a dancer roller, which is not illustrated, and by varying the rotation difference between the wire feeding bobbin 2 and the wire take-up bobbin 4. However, the cutting wire section CL shifts due to a change in a machining condition, such as when the cutting wire section CL performs scanning along the path in a reverse direction to that during the cutting or the cutting wire section CL is returned to the cutting start position of the cutting again and performs scanning along the same wire path as that at the time of the cutting. The change in the machining condition includes a change in the flow of the machining fluid due to the machined grooves GR that are formed by the cutting, a change in the frictional force between the cutting wire sections CL and the wire guide grooves 21 in the damping guide rollers 7a and 7b caused by a reversal of the machining direction, and a change in the external force acting on the cutting wire sections CL by weakening of the flow of the machining fluid set at the time of the shape correction compared to the time of the cutting. The flow of the machining fluid is set to 15 L/minute at the time of the cutting and is reduced to approximately 5 L/minute at the time of the shape correction, for example.

Note that, at the time of cutting the semiconductor ingot, the machining fluid is ejected powerfully from the nozzles 8a and 8b toward each machined groove GR, and, when the machining fluid is supplied toward the machined groove GR at the time of the shape correction under the same condition as that at the time of the cutting, the sheets vibrate widely before being separated from the semiconductor ingot. In electrical discharge machining, a large fluctuation in the discharge gap between the cutting wire sections CL and the cut surface of the semiconductor ingot, which is the workpiece 5, makes the electrical discharge machining unstable and causes a decrease in the accuracy of machining of the cut surface of the semiconductor wafer. Consequently, the flow of the machining fluid ejected from the nozzles 8a and 8b toward each machined groove GR is set lower at the time of the shape correction than at the time of the cutting.

In the shape correction process, shifting of each cutting wire section CL is prevented so that the cutting wire section CL performs scanning through the machined groove GR only one time by using the path of the cutting wire section CL at the time of the cutting process to simultaneously correct the shape of the two cut surfaces facing each other while the cutting wire section CL is interposed therebetween. The cutting wire sections CL are supported by the damping guide rollers 7a and 7b in a manner that the tension of the cutting wire sections CL fitted one by one into the V-shaped wire guide grooves 21 formed on each surface of the damping guide rollers 7a and 7b presses and holds the wires. Then, in the first embodiment, the cutting wire sections CL in the wire guide grooves 21, namely the wires 3, also receive the pressing force from a part not restrained by the wire guide grooves 21 and are thus restrained in order not to shift its position in the wire guide grooves 21 of the damping guide rollers 7a and 7b.

As illustrated in FIG. 3, the cutting wire sections CL are interposed between the V-shaped wire guide grooves 21 provided at a regular interval on each circumferential surface of the damping guide rollers 7a and 7b and the inverted V-shaped wire pressing protrusions 22 provided on each circumferential surface of the wire pressing sections 9a and 9b at the same interval as the interval at which the wire guide grooves 21 of the damping guide rollers 7a and 7b are formed. This allows the cutting wire sections CL to run at fixed positions in the wire guide grooves 21 of the damping guide rollers 7a and 7b. The cutting wire section CL in the wire guide groove 21, namely the wire 3, is then restrained in the wire guide groove 21 by three surfaces of the circumferential surface; therefore, shifting in the position does not occur even when a disturbance acts upon switching from cutting to shape correction and there is no change in the interelectrode distance between the wire 3 and each of the opposing cut surfaces interposing the wire 3 therebetween. Accordingly, in the shape correction, the interelectrode distance between each of the two opposing cut surfaces and the cutting wire section CL, namely the wire 3 between the two cut surfaces is the same as the interelectrode distance at the time of the cutting. As a result, the shape of the two opposing cut surfaces can be corrected simultaneously by the scanning of the cutting wire section CL performed only one time along the path of the cutting wire section CL at the time of the cutting. Therefore, high productivity and high machining accuracy can be achieved in the shape correction process.

According to the aforementioned method of manufacturing a semiconductor wafer, a machining path taken by the cutting wire section CL, namely a scanning path taken by the cutting wire section CL, is identical for the times of cutting and shape correction; therefore, there is no difference between the two interelectrode distances between the cutting wire section CL in the wire guide groove 21 making up the cutting wire section CL and each of the two cut surfaces facing each other with the cutting wire section CL interposed therebetween. As a result, the two cut surfaces are equally subjected to electrical discharge machining and thus simultaneously subjected to shape correction, whereby the wafers 5w can be mass-produced in one action with high accuracy, the wafers 5w having satisfactory and uniform machined surface quality as well as uniform thickness. The machining load required during wafer thickness uniforming processing in grinding or polishing that is a post-process after the wafer cutting can thus be reduced; therefore, the wafer costs can be reduced.

The cutting wire section CL in each of the wire guide grooves 21 adjacent to one another has a conduction path along the wire 3, the conduction path having impedance due to the electrical resistance of the wire 3 between the adjacent cutting wire sections CL. Moreover, in order to retain independence of each of the adjacent cutting wire sections CL, a conduction path other than the conduction path along the wire 3 should not be formed in each cutting wire section CL. The wire pressing sections 9a and 9b are thus made of an insulating material. The wire pressing protrusions 22 on the wire pressing sections 9a and 9b get into the wire guide grooves 21 from the side of the circumferential surfaces of the damping guide rollers 7a and 7b and hold down the cutting wire sections CL wound along the wire guide grooves 21 to prevent the position of the cutting wire sections CL from shifting in the wire guide grooves 21. Accordingly, instead of the protruding wire pressing protrusions 22, there may be provided a flexible material part made of a flexible material having flexibility such as rubber on the circumferential surfaces of the wire pressing sections 9a and 9b. In this case, the flexible material is pushed into the wire guide grooves 21 to follow the shape of the groove inner surfaces of the wire guide grooves 21 and hold the cutting wire sections CL, whereby shifting in the position of the cutting wire sections CL in the wire guide grooves 21 can be prevented.

The machining speed of wire electrical discharge machining does not depend on the hardness of the workpiece 5 and is thus particularly effective for material with a high hardness. The workpiece 5 can be a metal, such as tungsten and molybdenum that are to be a sputtering target, a ceramic, such as polycrystalline silicon carbide having silicon carbide as a main component, that is to be used for various structural members, a semiconductor material, such as single crystal silicon, single crystal silicon carbide, and gallium nitride that are to be a wafer substrate for manufacturing a semiconductor device, and silicon, such as single crystal silicon or polycrystalline silicon that is to be a wafer for a solar cell, for example. In particular, the semiconductor material having at least one of carbide and nitride, representative of which are silicon carbide and gallium nitride, as a component has high hardness and thus offers low productivity and has low machining accuracy when a method using a mechanical wire saw is employed. In contrast, the first embodiment can manufacture the wafer of the semiconductor material having at least one of carbide and nitride, such as silicon carbide and gallium nitride, as a component while achieving both high productivity and high machining accuracy. Moreover, the cutting and shape correction can be implemented collectively within the same machining apparatus; therefore, unnecessary polishing resulting from, for example, shifting in the position at the time the workpiece 5 is arranged in the machining apparatus is not required and thus the present embodiment is particularly effective for machining expensive wafers.

While the wire electrical discharge machining apparatus 100 of the first embodiment illustrates an example where the single wire 3 is wound around the four main guide rollers 1a to 1d, there can be adopted a configuration with an arrangement where there are two or three of the main guide rollers. Note that the wire electrical discharge machining apparatus 100 of the first embodiment suppresses current flowing through the wire between the adjacent power feed contacts K as much as possible due to the resistance between the power feed contacts K on the adjacent wires making up the parallel wire sections PS. That is, the value of the resistance between the power feed contacts K that is proportional to the wire length prevents the machining current from leaking to the discharge portion of the workpiece 5, or from going around into the discharge portion. Therefore, when the wire 3 is wound around the main guide rollers, it is only necessary to provide a single loop of the wire 3 that is long enough to increase the resistance between the power feed contacts K. In addition to the aforementioned embodiment, a specific configuration of the parallel wire sections PS is not particularly limited as long as the parallel wire sections are formed by repeatedly wrapping the single wire 3.

Moreover, at the time of the cutting, the external forces acting on the wires 3 in the wire guide grooves 21 of the damping guide rollers 7a and 7b press the wires 3 against the inner surfaces of the wire guide grooves 21 in a balanced manner. However, at a point when the machining is switched from the cutting to the shape correction, the balance among the external forces acting on the parallel wire sections PS changes due to a sudden change of at least one of the parameters of the machining condition including the parameter wire running speed, wire tension, and the flow of the machining fluid, namely fluid pressure or the direction of flow of the machining fluid, whereby the external forces become unbalanced to break the balance among the external forces acting on the wires 3 in the wire guide grooves 21. This causes a change in the direction of the force that acts on the wires 3 and presses the wires 3 against the inner surfaces of the wire guide grooves 21 at the time of the cutting, thereby causing shifting in the position of the wires 3. Accordingly, the sudden change in the parameter described above is highly likely to cause a change in the wire amplitude or a change in a discharge gap.

In this case, the parameter highly likely to cause the change in the wire amplitude or change in the discharge gap is set to have the same set value for the times of cutting and shape correction to allow the collective shape correction to be performed on the wafers by performing scanning while performing electrical discharge machining along the paths of the wires 3 at the time of the cutting. In the present embodiment, however, the wires 3 are pressed against the inner surfaces of the wire guide grooves 21 by the wire pressing sections 9a and 9b so as to be restrained, whereby the shape correction can be performed stably while preventing shifting in the position of the wires 3 even when the balance among the external forces changes. By the wires 3 being pressed against the inner surfaces of the wire guide grooves 21 by the wire pressing section 9a and 9b so as to be restrained, the shape correction can be performed stably while preventing shifting in the position of the wires 3 even when the set value of the parameter is changed for the times of cutting and shape correction.

Note that while it is assumed that the shape correction process for performing shape correction on the cut surface of the sheet is a single shape correction, the shape correction can be performed a plurality of times depending on the conditions, such as a shape correction condition or the material of the workpiece 5.

<Connection Removing Process>

Next, there will be described the connection removing process performed at step S30 in which the connections connected to the workpiece 5 are removed. After the shape correction is completed, the connections 5a by which the sheets are barely connected to the workpiece 5 are cut by electrical discharge machining. That is, the cutting wire sections CL are once again returned to the position at which the cutting is suspended and perform cutting by electrical discharge machining under the same electrical discharge machining condition as that at the time of the cutting. The cutting is performed while the workpiece 5 is moved relative to the cutting wire sections CL by the ascending/descending stage 10 that moves the workpiece 5 upward or downward in the cutting direction, i.e., in a vertical direction in FIG. 1. The connections 5a are cut while the electrical discharge machining condition and the speed of movement of the ascending/descending stage 10 are adjusted in accordance with the cut length of the connections 5a, i.e., such that the machining energy of the electrical discharge per length of the connections 5a facing the cutting wire sections CL is constant.

Completion of the connection removing process completes the process of simultaneously cutting the semiconductor wafers, namely manufacturing of the wafers, with the use of the wire electrical discharge machining apparatus 100; therefore, the wafers 5w are manufactured simultaneously. The wire electrical discharge machining apparatus 100 is used so as to be able to cut, with high productivity, the workpiece 5 containing hard material, such as silicon carbide or gallium nitride, into sheets.

Note that in the aforementioned description, the main guide rollers 1a to 1d, which are two pairs of main guide rollers, are used as the main guide rollers. However, the number of the main guide rollers is not limited as long as the main guide rollers make up the path from the wire feeding bobbin 2 to the wire take-up bobbin 4 and can secure space for the workpiece 5 to pass through the cutting wire sections CL but not to interfere with the rest of the wires.

The wire electrical discharge machining apparatus 100 according to the aforementioned first embodiment includes the pair of damping guide rollers 7a and 7b that are provided in parallel with the pair of main guide rollers 1c and 1d between the main guide rollers 1c and 1d and that follow the parallel wire sections PS so as to be in contact therewith and form the damped cutting wire sections CL, and the pair of wire pressing sections 9a and 9b that are provided in parallel with the pair of damping guide rollers 7a and 7b while facing them across the parallel wire sections PS and that press the parallel wire sections PS against the pair of damping guide rollers 7a and 7b in order to follow the parallel wire sections PS so as to be in contact therewith. The wire pressing sections 9a and 9b securely fix the wires 3 against the damping guide rollers 7a and 7b. The controller 14 of the wire electrical discharge machining apparatus 100 performs control such that the cutting wire sections CL perform scanning while performing electrical discharge machining along the paths of the cutting wire sections CL in the direction of cutting at the time of the cutting, and simultaneously corrects the shape of the cut surfaces that are cut at the time of the cutting.

Moreover, with the method of manufacturing a semiconductor wafer by using the wire electrical discharge machining apparatus 100 of the first embodiment, wire electrical discharge machining using the cutting wire sections CL as electrodes is performed to simultaneously cut the semiconductor ingot, which is the workpiece 5, into a plurality to wafers 5w. Here, in the cutting process, the sheets, i.e., the wafers 5w that have been incompletely cut, are not completely cut and thus not separated from the ingot, but the cutting is suspended with the tips of the machined grooves GR slightly connected to the ingot. Then, in the shape correction process, the cutting wire sections CL perform scanning through the machined grooves GR along the same path as that used at the time of the cutting while performing wire electrical discharge machining on the cut surface of each sheet formed during the cutting process. That is, during the scanning performed by the cutting wire section CL on each sheet, the cutting wire section CL machining the cut surface of each sheet performs electrical discharge machining along the path of the cutting wire section CL in the direction of cutting at the time of the cutting in order to perform shape correction while performing electrical discharge machining simultaneously on the two cut surfaces that face each other with the cutting wire section CL interposed therebetween. The shape correction is performed on the sheet by shaving off the thick portion resulting from, for example, the part left uncut during the cutting or the warpage of the sheet and then shaping the sheet to a predetermined thickness. The machining-affected layer on the surface of the sheet is also removed during the shape correction.

That is, according to the first embodiment, the cutting wire sections CL generate electrical discharge to simultaneously cut the ingot, which is the workpiece 5, into a plurality of sheets, namely the wafers 5w that have been incompletely cut, and they suspend the cutting before the sheets machined are completely cut and separated into the wafers 5w. The cutting wire sections CL then perform scanning while performing electrical discharge machining on the wafer surfaces that are being formed along the paths of the cutting wire sections CL used at the time of the cutting. This removes the part left uncut on the surfaces that are the wafer surfaces of the wafers 5w and the machining-affected layer so as to be able to have better uniformity in the wafer thickness and surface roughness, improve flatness of the wafer surface, and finish the wafers with a thickness close to the dimensions required of the wafers 5w.

According to the first embodiment, the wire pressing sections 9a and 9b are used to prevent shifting in the position of the cutting wire sections CL caused by the change in the pressing by the damping guide rollers 7a and 7b against the cutting wire sections CL, thereby preventing a fluctuation in the interelectrode distance between each cutting wire section CL and the cut surface. This can stabilize the electrical discharge machining performed by the cutting wire section CL against the two cut surfaces facing each other with the cutting wire section CL interposed therebetween and obtain, by single scanning, the wafers 5w having high quality with satisfactory uniformity of wafer thickness and surface roughness.

Moreover, according to the first embodiment, the cutting of the workpiece 5 into the wafers 5w as well as the shape correction on the wafers 5w can be performed collectively within the same apparatus. Accordingly, a device dedicated to each of the cutting and the shape correction is not required, and it is not necessary to transport the workpiece 5 from the cutting to the shape correction. This can cut down the cost and time to manufacture the wafers 5w.

Furthermore, according to the first embodiment, the paths of the wires 3 of the cutting wire sections CL used at the time of the cutting are used as the scanning paths of the cutting wire sections CL at the time of performing the shape correction on the wafers 5w that have been incompletely cut and that are the sheets formed during the cutting process. As a result, at the time of the shape correction, it is only necessary to move the workpiece 5 by the ascending/descending stage 10 in a direction different from the machining direction at the time of the cutting and in a direction opposite to the machining direction, whereby no special facility for the shape correction is required. The structure of the device and a peripheral of the wire electrical discharge machining apparatus can thus be simplified with no increase in the facility cost.

Therefore, according to the first embodiment, there can be realized an improvement in the machining accuracy when simultaneously cutting a semiconductor ingot that is the workpiece into a plurality of wafers as well as a reduction in the time required for the shape correction that is performed in order to improve the machining accuracy. That is, the shape correction performed one time can remove the part left uncut on the wafer surfaces of the sheets formed by the cutting, namely the wafers that have been incompletely cut, as well as the machining-affected layer; therefore, the machining accuracy when simultaneously cutting the wafers from the semiconductor ingot can be improved. As a result, a wafer having high quality close to a final specification with small fluctuations in the wafer thickness and satisfactory uniformity in the surface roughness can be obtained in large quantities by the single ingot cutting processing, whereby high productivity of the wafer with high machining accuracy can be achieved. This can reduce the load due to the grinding or polishing performed in a wafer machining process that is a post-process performed after cutting the wafers and can reduce the total machining time and the setup process required for wafer machining. Therefore, a cost reduction for the wafer can be achieved.

Second Embodiment

Figure 8:
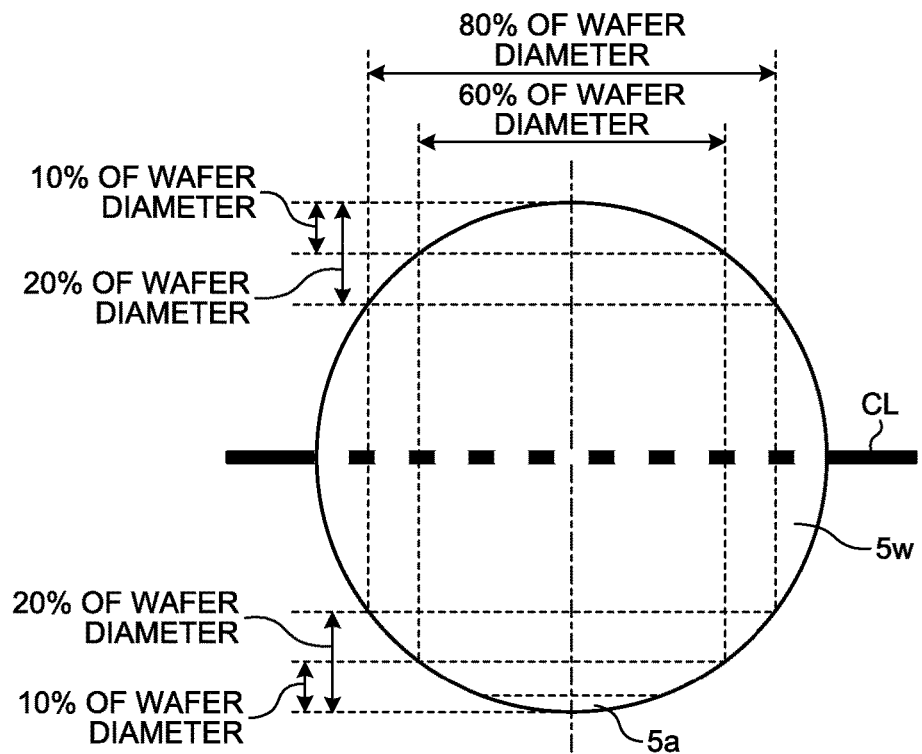
FIG. 8 is a schematic diagram illustrating an outer shape along a wafer surface direction of a wafer that has been incompletely cut and that is obtained after the wire electrical discharge machining apparatus according to the second embodiment of the present invention performs the cutting process on a cylindrical workpiece.

In a second embodiment, there will be a description of a case where, during cutting performed by the wire electrical discharge machining apparatus 100, an electrical discharge machining condition is adjusted on the basis of the amount of shape correction in accordance with the machined shape due to a machining characteristic typical of wire electrical discharge machining. FIG. 8 is a schematic diagram illustrating an outer shape along a wafer surface direction of the wafer 5w that has been incompletely cut and that is obtained after the wire electrical discharge machining apparatus 100 according to the second embodiment performs a cutting process on the cylindrical workpiece 5. Note that after the cutting process, the wafer 5w is still connected to the workpiece 5 by the connection 5a. For reference purposes, FIG. 8 illustrates the position of the cutting wire section CL at the time of the cutting process. Moreover, the wafer 5w illustrated in FIG. 8 is cut from the top to the bottom of FIG. 8.

The outer shape of a semiconductor wafer used in manufacturing a semiconductor device is normally circular along the wafer surface direction. A semiconductor ingot from which the semiconductor wafer is manufactured is machined into a cylindrical shape. The cylindrical semiconductor ingot is then cut perpendicularly to the axial direction of the semiconductor ingot from the side of a curved circumferential surface and thus a circular semiconductor wafer is obtained. Therefore, during the cutting performed on the workpiece 5 that is the cylindrical semiconductor ingot, the cut length varies according to the machined distance from the cutting start position as illustrated in FIG. 8. The machined distance is a distance by which the cutting wire section CL of the wire electrical discharge machining apparatus 100 performs machining in a direction in which the cutting wire section moves relative to the semiconductor ingot, which is the workpiece 5, namely in a cutting direction at the time of the cutting. The cut length is a length by which the cutting wire section CL of the wire electrical discharge machining apparatus 100 forms a discharge gap while facing the semiconductor ingot in the cutting direction at the time of the cutting.

When the machining energy due to electrical discharge is not adjusted according to a change in the cut length of the workpiece 5 during wire electrical discharge machining, the cut surface is machined too much and has a reduced thickness or too much of the cut surface is left and thus the cut surface has an increased thickness, resulting in uneven wafer thickness. Moreover, a machining characteristic according to bending of a wire typical of wire electrical discharge machining causes the wafer surface to have a gentle arc shape in the wire running direction and the thickness near the diameter portion to be the smallest; therefore, it is difficult to machine a semiconductor wafer having a flat wafer surface. However, the shape of the cut surface is corrected so as to be able to obtain a semiconductor wafer having a flat wafer surface by suspending the cutting and performing electrical discharge machining on the cut surface formed until the suspension of the cutting, as illustrated in the first embodiment.

Figure 9:
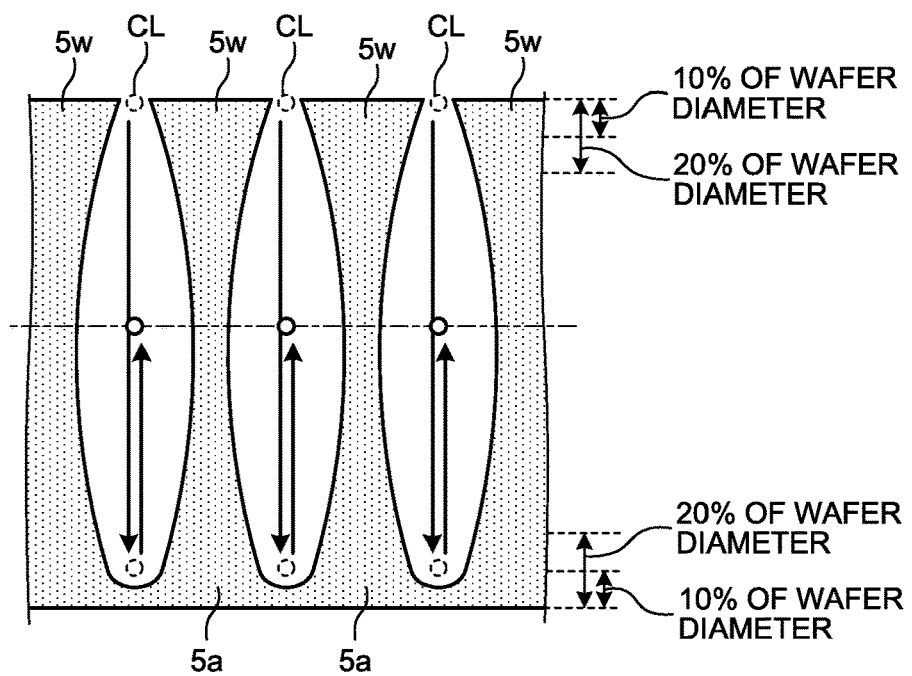
FIG. 9 is a cross-sectional view illustrating a cut shape of the wafers that have been incompletely cut and that are obtained after the wire electrical discharge machining apparatus according to the second embodiment of the present invention performs the cutting process on the cylindrical workpiece, as viewed from an outer peripheral side in a wire running direction.
Figure 10:
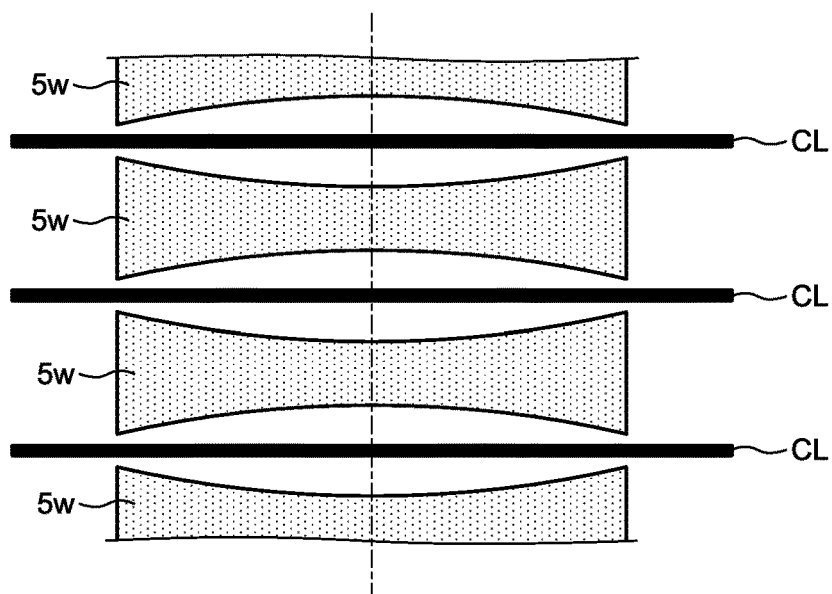
FIG. 10 is a cross-sectional view illustrating a cut shape of the wafers that have been incompletely cut and that are obtained after the wire electrical discharge machining apparatus according to the second embodiment of the present invention performs the cutting process on the cylindrical workpiece, as viewed from a side on which machining starts.

FIG. 9 is a longitudinal cross-sectional view of the wafers 5w that have been incompletely cut and that are obtained after the wire electrical discharge machining apparatus 100 according to the second embodiment performs the cutting process on the cylindrical workpiece 5. FIG. 9 illustrates the longitudinal cross section along the center of the diameter of the wafers 5w in the running direction of the wires 3. Note that after the cutting process, the wafers 5w are still connected to the workpiece 5 by the connections 5a. FIG. 10 is a transverse cross-sectional view of the wafers 5w that have been incompletely cut and that are obtained after the wire electrical discharge machining apparatus 100 according to the second embodiment performs the cutting process on the cylindrical workpiece 5. FIG. 10 illustrates the transverse cross section along the center of the diameter of the wafers 5w in the cutting direction. Arrows in FIG. 9 indicate paths of the cutting wire sections CL, i.e., pathways along which the cutting wire sections CL pass.

When the cutting process is performed on the wafers 5w, the cut length at a machining position corresponding to 10% of the diameter of the cylindrical workpiece 5 in the cutting direction equals 60% of the diameter of the workpiece 5. That is, the cut length changes from 0% to 60% of the diameter of the workpiece 5 while the machined distance from the cutting start position changes from 0% to 10% of the diameter of the workpiece 5. In this machining section, the cut length changes to a large extent with respect to the machined distance while at the same time it is not easy to make the flow of machining fluid constant through the machined grooves GR, whereby each wire 3 of the cutting wire section CL tends to vibrate. The machining section is thus a region in which it is difficult to control the machining energy of electrical discharge.

Therefore, the wafer 5w that has been incompletely cut and that is obtained by cutting the workpiece 5 tends to be thick in a part where the cut length increases or decreases sharply, as schematically illustrated in FIG. 9. The cut length however extends to 80% of the diameter of the workpiece 5 when the machined distance is increased to merely 20% of the diameter of the cylindrical workpiece 5. From then on, the cut length increases gradually until the machining position reaches a position at which the machined distance equals 50% of the diameter of the workpiece 5, i.e., the diameter portion of the workpiece 5; therefore, a change in the wafer thickness is decreased.

On the other hand, until the cutting is suspended after the machined distance exceeds the position corresponding to 50% of the diameter of the cylindrical workpiece 5, the cut length changes in a pattern opposite to that from the start of the cutting until the machining position reaches a position at which the machined distance equals 50% of the diameter of the cylindrical workpiece 5.

Moreover, as schematically illustrated in FIG. 10, the cut shape along the running direction of the wire 3 of the cutting wire section CL corresponds to a shape to which string vibration in a one-dimensional mode is transferred with a part of the wire 3 supported by the damping guide rollers 7a and 7b as a node. Accordingly, the amount of machining increases the most at the diameter portion of the wafer 5w, namely the position at which the machined distance equals 50% of the diameter of the cylindrical workpiece 5, where a difference in the thickness of the wafer surface with respect to other parts increases. Note that the difference in the thickness within the cut surface of the wafer 5w is larger along the cutting direction than the running direction of the wire 3.

A difference in the shape of the cut surfaces of the wafers 5w is improved by controlling the machining energy due to electrical discharge according to the position of the cutting wire sections CL on the workpiece 5 at the time of the cutting. In order to further improve machining accuracy of the shape of the cut surfaces of the wafers 5w, however, it is effective to perform shape correction in which the cutting wire sections CL perform scanning on the cut surfaces of the wafers 5w that have been incompletely cut while performing electrical discharge machining thereon once again to flatten the cut surfaces of the wafers 5w. Note that after the shape correction, the connections 5a are removed by cutting in a connection removing process, whereby a plurality of the wafers 5w are simultaneously manufactured by separating each wafer 5w from the workpiece 5.

As with the first embodiment, during the shape correction, the cutting wire sections CL perform scanning while performing electrical discharge machining by using the paths of the cutting wire sections CL identical to the paths at the time of the cutting. A variation in the thickness as well as a difference in the shape of the wafers 5w that have been incompletely cut vary depending on the electrical discharge machining condition at the time of the cutting, and thus the electrical discharge machining condition needs to be adjusted according to the amount of shape correction. Note that while different in the degree of the thickness, the cut surfaces of the wafers 5w that have been incompletely cut have the shape illustrated in FIGS. 9 and 10 due to a characteristic of wire electrical discharge machining; therefore, one may refer to the position illustrated in FIG. 8 for the timing at which to change the machining condition.

The machining speed at the time of cutting is relatively reduced in a region in which the change in the cut length is large relative to the machined distance, for example. The machining speed is relatively reduced in a cutting start region in which the machined distance extends to the position corresponding to 20% of the diameter of the wafer 5w from the cutting start position and in a cutting end region in which the remaining distance of the machined distance corresponds to the position away from a final cutting end position by 20% of the diameter of the wafers 5w. Here, the diameter of the wafers 5w is the same as the diameter of the cylindrical workpiece 5. Moreover, at the time of the cutting, the machining speed is relatively increased in a region that is outside the aforementioned region and in which the change in the cut length is small relative to the machined distance. Electrical discharge machining is focused on a thick part of the wafers 5w illustrated in FIG. 9 in the region where the low machining speed is set. That is, electrical discharge machining is focused on the thick part on each of the upper and lower sides of the wafer 5w illustrated in FIG. 8. Then, in the region where the high machining speed is set, machining is focused on a thick part of the wafers 5w illustrated in FIG. 10. That is, electrical discharge machining is focused on the thick part on each of the right and left sides of the wafer 5w illustrated in FIG. 8. The shape correction is efficiently performed on the wafers 5w as a result.

A difference in the thickness within the wafer surfaces of the wafers 5w is larger along the machining direction than the running direction of the wires 3. Accordingly, at the time of machining the thick part of the wafers 5w illustrated in FIG. 10, the shape correction can be definitely performed on the cut surfaces even when the machining speed is set higher than that at the time of machining the thick part of the wafers 5w illustrated in FIG. 9. That is, the machining speed in the region where the change in the cut length is small relative to the machined distance is increased so as to be able to efficiently perform the shape correction on the cut surfaces. The control of the machining speed is still effective when the shape correction is performed simultaneously on two cut surfaces facing each other with the cutting wire section CL interposed therebetween, whereby the cost of the wafers 5w can be reduced.

Moreover, when one wishes to further reduce the time required for the shape correction, the machining speed is relatively reduced in a cutting start region in which the change in the cut length is the largest relative to the machined distance and in which the machined distance from the cutting start position corresponds to 10% or less of the diameter of the wafers 5w and in a cutting end region in which the remaining distance of the machined distance to a final cutting end position corresponds to 10% or less of the diameter of the wafers 5w. Moreover, the machining speed is relatively increased in a region that is outside the aforementioned region and in which the change in the cut length is small relative to the machined distance. That is, the scanning speed in the cutting direction of the cutting wire sections CL is relatively reduced in the outer edge region of the cut surfaces that extends from the position at which the machined distance from both ends of the workpiece 5 corresponds to 10% of the diameter of the workpiece 5 to both ends of the workpiece 5 along the cutting direction at the time of the cutting. Then, in a region excluding the outer edge region of the cut surfaces along the cutting direction at the time of the cutting, the scanning speed in the cutting direction of the cutting wire sections CL is relatively increased. As a result, the shape correction can be more efficiently performed in short time.

The shape correction may be performed on the wafer surfaces of the wafers 5w insufficiently when the region in which the machining speed is relatively reduced is a cutting start region in which the machined distance from the cutting start position corresponds to less than 10% of the diameter of the wafers 5w and a cutting end region in which the remaining distance of the machined distance to a final cutting end position corresponds to less than 10% of the diameter of the wafers 5w. Moreover, the shape correction may not be performed efficiently on the wafer surfaces of the wafers 5w when the region in which the machining speed is relatively increased is a region in which the machined distance from the cutting start position corresponds to more than 20% of the diameter of the wafers 5w and a region in which the remaining distance of the machined distance to the final cutting end position corresponds to larger than 20% of the diameter of the wafers 5w.

As described above, in the second embodiment, the machining speed is relatively reduced in the region where the change in the cut length is large relative to the machined distance, whereas the machining speed is relatively increased in the region where the change in the cut length is small relative to the machined distance during the shape correction performed on the cut surfaces of the wafers 5w according to the machining characteristic due to bending of the wire typical of wire electrical discharge machining. Therefore, according to the second embodiment, the shape correction can be performed simultaneously and efficiently on the two cut surfaces facing each other with the wire 3 interposed therebetween.

Third Embodiment

As described above, the wire electrical discharge machining apparatus 100 uses the wire pressing sections 9a and 9b to prevent shifting in the position of the cutting wire sections CL caused by the change in the pressing of the cutting wire sections CL against the damping guide rollers 7a and 7b. However, the paths of the cutting wire sections CL at the time of the shape correction may shift from the paths of the cutting wire sections CL at the time of the cutting due to the machining characteristic caused by the bending of the wire typical of wire electrical discharge machining; therefore, the electrical discharge machining may be biased toward one of the wafers 5w that have been incompletely cut and thus a situation is possibly caused where it is difficult for single scanning by the cutting wire sections CL to simultaneously perform shape correction. In a third embodiment, there will be described a change in an electrical discharge machining condition so as to be able to deal with the aforementioned situation and reduce the bias in the frequency of electrical discharge machining performed at the time of shape correction.

Roughness of a machined surface is an important quality factor in cutting a workpiece. However, with wafer cutting performed to cut a wafer, a variation in the thickness within the machined surface of each wafer being cut is a more important quality factor. That is, even when the roughness of the machined surface is acceptable, a large variation in the thickness within the machined surface makes it necessary to make the thickness uniform in accordance with the thinnest part of a single wafer at the time of grinding performed in a post-process in order to make the wafer flat. Therefore, the load of a grinding process in the post-process is increased when there is a large variation in the wafer thickness.

It is thus important to reduce the variation in the thickness of the single wafer even by sacrificing the roughness of the machined surface of the wafer to some degree. Accordingly, even when a discharge gap is changed, the shape correction can be performed simultaneously on two wafers that have been incompletely cut and that face each other with the cutting wire section CL interposed therebetween by absorbing an influence of the change in the discharge gap to reduce the bias in the frequency of electrical discharge machining. That is, the discharge gap between the cutting wire section CL and cut surfaces of the two wafers that have been incompletely cut and that face each other with the cutting wire section CL interposed therebetween is decreased on one side and increased on another side when the cutting wire section CL is closer to one of the cut surfaces. In this case, the shape correction is performed while performing electrical discharge machining under a machining condition for a case with a discharge gap that is larger than or equal to the increased discharge gap.

That is, at the time of the shape correction, at least one of the machining conditions is set larger than that at the time of cutting to increase the range of electrical discharge, i.e., a distance reached by electrical discharge, wherein the machining conditions include applied voltage being applied across each cutting wire section CL and the workpiece 5, peak machining current per electrical discharge, and a discharge pulse width. The inventors have found by experiment that an adjustment on these machining conditions can improve a condition in which a slight difference in the discharge gap causes a difference in the frequency of electrical discharge and a difference in the amount of shape correction performed by the shape correction under the electrical discharge machining condition at the time of the cutting. As a result, the adjustment on these machining conditions can increase the range of electrical discharge, namely the distance reached by electrical discharge; therefore, a slight difference in the discharge gap does not cause the difference in the frequency of occurrence of electrical discharge, namely the bias in the frequency of electrical discharge machining, and thus the shape correction can be performed simultaneously on the cut surfaces of the two wafers that have been incompletely cut.

There will be illustrated an example of adjusting the machining condition when the workpiece 5 is a semiconductor ingot. The applied voltage is set to 100 V at the time of the cutting and approximately 105 V to 110 V at the time of the shape correction to thus allow the cutting wire section CL to perform the shape correction simultaneously on the two cut surfaces facing each other in single scanning without causing electrical discharge to be performed on one of the two cut surfaces facing each other with the cutting wire section CL interposed therebetween. Moreover, the peak machining current is set to 3 A to 4 A per electrical discharge at the time of the cutting and approximately 5 A to 7 A at the time of the shape correction to thus allow the cutting wire section CL to perform the shape correction simultaneously on the two cut surfaces facing each other in single scanning. Furthermore, the discharge pulse width is set to 0.6 μsec at the time of the cutting and 1.8 μsec to 3 μsec at the time of the shape correction to thus allow the two cut surfaces facing each other to be subjected to the shape correction simultaneously. These machining conditions are not particularly limited but may be adjusted as appropriate according to conditions, such as the type and thickness of the wires 3 being used as well as the material of the workpiece 5.

Note that according to the experiment by the inventors, the roughness of the wafer surface of a wafer being cut during the cutting of an ingot made of silicon carbide is reduced slightly more when the peak machining current is increased at the time of the shape correction than when the peak machining current is not increased at the time of the shape correction. However, the thickness of a machining-affected layer is not increased due to a material characteristic. Although a region sublimating to be removed increases due to the increase in the peak machining current to result in an increase in the width of a machined groove, namely the width to be cut, the machining-affected layer itself caused by thermal effect does not become larger; therefore, the amount of grinding in the grinding performed in the post-process is not increased.

According to the third embodiment described above, the electrical discharge machining condition at the time of the shape correction is adjusted to increase the range of electrical discharge at the time of the shape correction. As a result, as with the aforementioned embodiments, electrical discharge machining is performed while the cutting wire section CL performs scanning along the path of the wire 3 of the cutting wire section CL identical to the path used at the time of the cutting to thus allow the shape correction to be performed simultaneously on the two cut surfaces facing each other with the cutting wire section CL interposed therebetween. Therefore, according to the third embodiment, the shape correction on the shape of the wafer can be performed efficiently so as to be able to reduce the cost of the wafer.

The configuration according to the aforementioned embodiments merely illustrates an example of the content of the preset invention, and can thus be combined with another known technique or partially omitted and/or modified without departing from the gist of the present invention.

REFERENCE SIGNS LIST 1a, 1b, 1c, 1d main guide roller, 2 wire feeding bobbin, 3 wire, 4 wire take-up bobbin, 5 workpiece, 5a connection, 5b uneven portion, 5w wafer, 6a, 6b, 6c, 6d power feed contact unit, 7a, 7b damping guide roller, 8, 8a, 8b nozzle, 9a, 9b wire pressing section, 10 ascending/descending stage, 11 power supply unit, 12 feeder, 13 holding member, 14 controller, 21 wire guide groove, 22 wire pressing protrusion, 31 machined area, 32 machined area, 100 wire electrical discharge machining apparatus, CL cutting wire section, GR machined groove, K power feed contact, PS parallel wire section.

The invention claimed is:

1. A wire electrical discharge machining apparatus that generates electrical discharge between a workpiece and a wire electrode and performs electrical discharge machining on the workpiece with energy due to the electrical discharge, the wire electrical discharge machining apparatus comprising:
   a plurality of parallel wire sections that are formed by winding a piece of the wire electrode around a plurality of guide rollers and includes a region facing the workpiece;
   a pair of damping guide rollers that is provided in parallel with the guide rollers, follows the parallel wire sections so as to be in contact with the parallel wire sections, and forms a plurality of damped cutting wire sections within the parallel wire sections;
   a pair of wire pressing sections that is provided in parallel with and facing the pair of damping guide rollers across the parallel wire sections, presses the parallel wire sections against the pair of damping guide rollers, and follows the parallel wire sections to be in contact with the parallel wire sections;
   a power source to apply voltage across each of the parallel wire sections and the workpiece arranged to face the cutting wire sections;
   an ascending/descending stage to move the workpiece relative to the cutting wire sections; and
   a controller to control an operation of the wire electrical discharge machining apparatus, wherein
   the controller controls cutting and shape correction under different machining conditions, the cutting being performed to simultaneously cut a plurality of wafers by performing electrical discharge machining while moving the workpiece relative to the cutting wire sections and leave a connection at which a part of each of the wafers that are incompletely cut is still connected to the workpiece; and the shape correction being performed to cause the cutting wire sections to perform relative movement while performing electrical discharge machining along a path identical to a path of the cutting wire sections in a cutting direction at a time of the cutting to correct a shape of each of two surfaces of a plurality of cut surfaces that are cut at the time of the cutting, the two surfaces facing each other while interposing the cutting wire section between the two surfaces.

2. The wire electrical discharge machining apparatus according to claim 1, wherein the different machining conditions comprise at least one of applied voltage that is applied across the cutting wire sections and the workpiece, peak machining current per the electrical discharge, a discharge pulse width machining voltage of the electrical discharge, and a machining speed.

3. The wire electrical discharge machining apparatus according to claim 2, wherein the controller performs control so as to set at least one of conditions larger in the shape correction than in the cutting, the conditions including the applied voltage, peak machining current per the electrical discharge, and a discharge pulse width of the electrical discharge.

4. The wire electrical discharge machining apparatus according to claim 1, wherein
   the workpiece has a cylindrical shape, and
   in the shape correction, the controller relatively reduces a scanning speed in the cutting direction of the cutting wire sections in an outer edge region of the cut surfaces that extends from both ends of the workpiece to a position at which a machined distance from the both ends corresponds to 10% of a diameter of the workpiece along the cutting direction at a time of the cutting, and relatively increases a scanning speed in the cutting direction of the cutting wire sections in a region excluding the outer edge region of the cut surfaces.

5. A wire electrical discharge machining apparatus that generates electrical discharge between a workpiece and a wire electrode and performs electrical discharge machining on the workpiece with energy due to the electrical discharge, the wire electrical discharge machining apparatus comprising:
   a plurality of parallel wire sections that are formed by winding a piece of the wire electrode around a plurality of guide rollers and includes a region facing the workpiece;
   a power source to apply voltage across each of the parallel wire sections and the workpiece arranged to face the parallel wire sections;
   an ascending/descending stage to move the workpiece relative to the parallel wire sections; and
   a controller to control an operation of the wire electrical discharge machining apparatus, wherein
   the controller controls cutting and shape correction under different machining conditions, the cutting being performed to simultaneously cut a plurality of wafers by performing electrical discharge machining while moving the workpiece relative to the parallel wire sections and leave a connection at which a part of each of the wafers that are incompletely cut is still connected to the workpiece; and the shape correction being performed to cause the parallel wire sections to perform relative movement while performing electrical discharge machining along a path identical to a path of the parallel wire sections in a cutting direction so that an interelectrode distance between each of the two surfaces and the wire during the shape correction is identical to each other, at the time of the cutting to correct a shape of each of two surfaces of a plurality of cut surfaces that are cut at the time of the cutting, the two surfaces facing each other while interposing the parallel wire section between the two surfaces.

6. A method of manufacturing a semiconductor wafer by generating electrical discharge between a plurality of cutting wire sections that are running and a workpiece made of a semiconductor material, performing electrical discharge machining on the workpiece with energy due to the electrical discharge, and cutting the workpiece into a plurality of wafers simultaneously, the method comprising:

forming the cutting wire sections that are damped by interposing a plurality of wire members running in parallel with each other between a pair of damping guide rollers and a pair of wire pressing sections;

a cutting process of performing cutting of simultaneously cutting the workpiece into the wafers by performing electrical discharge machining while moving the workpiece relative to the cutting wire sections and performing the cutting while leaving a connection at which a part of each of the wafers that are incompletely cut is still connected to the workpiece; and a shape correction process of causing the cutting wire sections to perform relative movement while performing electrical discharge machining along a path identical to a path of the cutting wire sections in a cutting direction at a time of the cutting and correcting a shape of each of two surfaces of a plurality of cut surfaces that are cut at a time of the cutting, the two surfaces facing each other while interposing the cutting wire section between the two surfaces, wherein a machining condition is different between the cutting process and the shape correction process.

7. The method of manufacturing a semiconductor wafer according to claim 6, wherein the machining condition is at least one of applied voltage that is applied across the cutting wire sections and the workpiece, peak machining current per the electrical discharge, a discharge pulse width machining voltage of the electrical discharge, and a machining speed.

8. The method of manufacturing a semiconductor wafer according to claim 7, wherein the shape correction process includes setting at least one of conditions larger than in the shape correction process than in the cutting, the conditions including the applied voltage, peak machining current per the electrical discharge, and a discharge pulse width of the electrical discharge.

9. The method of manufacturing a semiconductor wafer according to claim 6, wherein the workpiece has a cylindrical shape, and the shape correction process includes:

relatively reducing a scanning speed in the cutting direction of the cutting wire sections in an outer edge region of the cut surfaces that extends from both ends of the workpiece to a position at which a machined distance from the both ends corresponds to 10% of a diameter of the workpiece along the cutting direction at a time of the cutting; and relatively increasing a scanning speed in the cutting direction of the cutting wire sections in a region excluding the outer edge region of the cut surfaces.

10. The method of manufacturing a semiconductor wafer according to claim 6, further comprising:

a connection removing process of removing the connection after the shape correction process, wherein a plurality of wafers are manufactured from the workpiece.

11. The method of manufacturing a semiconductor wafer according to claim 6, wherein the workpiece is made of a semiconductor material having at least one of carbide and nitride as a component.

\* \* \* \* \*